United States Patent
Miyaki et al.

(10) Patent No.: US 6,960,823 B2
(45) Date of Patent: Nov. 1, 2005

(54) SEMICONDUCTOR DEVICE AND METHOD OF MANUFACTURING THE SAME

(75) Inventors: Yoshinori Miyaki, Tachikawa (JP);
Hiromichi Suzuki, Tokyo (JP);
Kazunari Suzuki, Tokyo (JP);
Kunihiko Nishi, Kokubunji (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/114,940

(22) Filed: Apr. 4, 2002

(65) Prior Publication Data

US 2002/0146864 A1  Oct. 10, 2002

(30) Foreign Application Priority Data

Apr. 4, 2001 (JP) ....................... 2001-105886

(51) Int. Cl.[7] ....................... H01L 23/495; H01L 23/48
(52) U.S. Cl. ....................... 257/676; 257/783
(58) Field of Search ....................... 438/106–112, 118, 438/123–127; 257/677, 666, 670, 672, 678, 782, 783, 787

(56) References Cited

U.S. PATENT DOCUMENTS

| | | | | |
|---|---|---|---|---|
| 5,429,992 A | * | 7/1995 | Abbott et al. | 437/206 |
| 5,960,260 A | * | 9/1999 | Umehara et al. | 438/118 |
| 6,081,978 A | * | 7/2000 | Utsumi et al. | 29/25.01 |
| 6,087,714 A | * | 7/2000 | Kubara et al. | 257/666 |
| 6,291,273 B1 | * | 9/2001 | Miyaki et al. | 438/123 |
| 6,372,351 B1 | * | 4/2002 | Takemiya et al. | 428/416 |
| 6,376,905 B2 | * | 4/2002 | Hisano et al. | 257/691 |
| 6,441,400 B1 | * | 8/2002 | Miyaki et al. | 257/66 |
| 2003/0001249 A1 | * | 1/2003 | Shimanuki | 257/678 |

FOREIGN PATENT DOCUMENTS

| | | | | |
|---|---|---|---|---|
| JP | 05-270860 | | 10/1993 | ............ C03C/8/02 |
| JP | 8-204107 | * | 8/1996 | ........... H01L/23/50 |
| JP | 10-093004 | | 4/1998 | ........... H01L/23/50 |
| JP | WO98/29903 | * | 7/1998 | ........... H01L/21/56 |
| JP | 11-179586 | | 7/1999 | ........... B23K/35/26 |
| JP | 11-221694 | | 8/1999 | ........... B23K/35/26 |
| JP | 11-330340 | | 11/1999 | ........... H01L/23/50 |
| JP | 2000-77435 | * | 3/2000 | ........... H01L/21/52 |
| JP | 2001-230360 | | 8/2001 | ........... H01L/23/50 |

* cited by examiner

*Primary Examiner*—Olik Chaudhuri
*Assistant Examiner*—Lex H. Malsawma
(74) *Attorney, Agent, or Firm*—Antonelli, Terry, Stout and Kraus, LLP.

(57) ABSTRACT

To improve a reflow characteristic and realize leadlessness. A semiconductor device comprises a cross die pad which supports a semiconductor chip and in which an area of the region joined to the semiconductor chip is smaller than that of the outer size thereof being smaller than the rear surface of the semiconductor chip; wires connected to pads of the semiconductor chip; a plurality of inner leads which are arranged around the semiconductor chip and in which a silver plating layer is formed at a wire bonding area; molding resin for resin sealing the semiconductor chip; a plurality of outer leads exposed from the molding resin and in which a lead-free metallic layer is formed on a contact surface, wherein the flat surface size of the molding resin is formed to be equal to or less than 28 mm×28 mm and the thickness thereof is formed to be 1.4 mm or less, and thereby it is possible to improve a reflow characteristic and realize leadlessness.

3 Claims, 25 Drawing Sheets

FIG.19

| PACKAGE TYPE \ ITEM | MOLDING RESIN THICKNESS |
|---|---|
| QFP | MORE THAN 2.0mm |
| LQFP | 1.4mm |
| TQFP | 1.0mm |
| QFN | 0.45~2.50mm |

FIG.20

WIRE: GOLD WIRE

| THE VOLUME OF MOLDING RESIN \ PLATING MATERIAL / CHECK ITEM | SILVER | | PALLADIUM | |
|---|---|---|---|---|
| | WIRE CRACK | COST | WIRE CRACK | COST |
| LARGE | × | ○ | ○ | △ |
| SMALL | ○ | ○ | ○ | △ |

SEMICONDUCTOR DEVICE AND METHOD OF MANUFACTURING THE SAME

BACKGROUND OF THE INVENTION

The present invention relates to a manufacturing technology of a semiconductor device, and more specifically, to a technology effectively applied to lead-free exterior solder plating in a semiconductor device having a small die pad structure.

In a typical assembly process of manufacturing a semiconductor package equipped with a semiconductor chip (semiconductor device), die bonding, wire bonding, resin sealing and the like are carried out one after another. Thereafter, in an exterior plating process, a tin (Sn)-lead (Pb) based solder layer is typically formed as an exterior plating on a surface spot including a contact portion (surface to be packaged) of a substrate of a lead (hereinafter referred to as an outer lead) that is not sealed with molding resin in order to be packaged onto a printed circuit board or a circuit board.

However, in recent years, countermeasures against environmental damage have become very important, especially with regard to lead (Pb). For example, as pointed out in Japanese Patent Laid-Open No. 5-270860, it is required to reduce lead to an appropriate level, even in electronic parts such as a semiconductor devices, a packaging boards and the like, from an environmental viewpoint. Therefore, it is preferable to provide solders which replace tin (Sn)-lead (Pb) based solder, and such a proposal has been made in, for example, in Japanese Patent Laid-Open Applications No. 10-93004, No. 11-179586, No. 11-221694, No. 11-330340 and the like.

First, in Japanese Patent Laid-Open No. 10-93004, an invention using tin (Sn)-bismuth (Bi) based solder as lead-free solder to replace tin-lead based solder has been proposed. In particular, a technology for making solder connections easier has been described by forming a tin-bismuth based alloy layer on an external connection electrode lead wire of electronic parts.

Further, in Japanese Patent Laid-Open No. 11-179586, a technology for ensuring sufficient connection strength by use of Sn—Ag—Bi based solder has been proposed as a lead-free solder which replaces tin-lead based solder.

Additionally, in Japanese Patent Laid-Open No. 11-221694, a technology for improving reliability of a connection portion by use of Sn—Ag—Bi—In based solder has been proposed as a lead-free solder which replaces tin-lead based solder.

Also, in Japanese Patent Laid-Open No. 11-330340, a semiconductor device in which an Sn—Bi based plating film is formed on a lead has been introduced, and a technology for preventing the occurrence of cracks and being capable of a solder connection with a high degree of reliability has been proposed.

In the case where Sn—Pb eutectic substitutional lead-free solder is employed in exterior plating, an Sn base alloy is typically selected depending on the applications. Especially in applications such as car packaging parts, presently developing mobile electronic equipment and highly reliable parts, an alloy that is excellent in bonding strength and in heat resistant fatigue characteristics is desired. As an Sn base alloy that is excellent in bonding strength and in heat resistant fatigue characteristics, and which also has high reliability, an Sn—Ag based alloy is known. The fusion point of Sn—Pb eutectic solder is generally 183° C. while the fusion point of most Sn—Ag based alloys is 200° C. or more. Therefore, the temperature is higher for the fusion point of Sn—Ag based alloys than the fusion point of the Sn—Pb eutectic solder.

Therefore, at present, the reflow temperature for packaging a semiconductor integrated circuit using Sn—Pb eutectic substitutional lead-free solder inevitably becomes high. Therefore, the present inventors have packaged a semiconductor integrated circuit device in which an inner lead is Ag plated and an outer lead is plated at a reflow temperature higher than the conventional reflow temperature by use of lead-free substitutional solder whose the fusion point is higher than that of Sn—Pb eutectic solder, and have conducted evaluations thereof. As a result, it has been found that product failures are caused due to wire disconnection.

As a countermeasure for such wire disconnection, the present applicant has considered that hard palladium (pd) plating could be performed on a wire joining portion of an inner lead and thereby the thickness of a bonding root portion of a wire is ensured to increase the bonding strength, as shown in Japanese Patent Application No. 2000-46724. However, there is a problem that the palladium plating increases the cost.

Note that, in the above-mentioned four references, there are no descriptions that, in the case of using lead-free solder, the reflow temperature becomes high and thereby the reflow margin of the semiconductor device becomes small. There is also no description regarding countermeasures for this problem.

An object of the present invention is to provide a semiconductor device and a method of manufacturing the semiconductor device, which improves a reflow characteristic and realizes a practical lead-free arrangement.

Another object of the present invention is to provide a semiconductor device and a method of manufacturing the semiconductor device, which suppresses increases in cost in lead-free arrangements.

The above-mentioned and other objects and novel features of the present invention will become apparent from the present description in conjunction with the appended drawings.

SUMMARY OF THE INVENTION

An outline of representative examples of the inventions disclosed in the present application will be briefly explained as below.

The present invention includes a semiconductor chip mounting portion in which an area of the region joined to a semiconductor chip is smaller than that of the rear surface of the semiconductor chip; a plurality of inner leads in which a silver plating layer is formed on a wire bonding area; molding resin for resin sealing the semiconductor chip; and a plurality of outer leads in which a lead-free metallic layer is formed on a contact surface thereof, and is an LQFP or a TQFP in which the flat surface size of the molding resin is formed to be equal to or less than 28 mm×28 mm.

Further, the outlines of other inventions of the present application will be hereinafter briefly described in terms of classification into sections as set forth below:

1. A semiconductor device which comprises:

a die pad supporting a semiconductor chip and being smaller in outer size than the surface opposite to the semiconductor die surface of said semiconductor chip;

a wire connected to a surface electrode of said semiconductor chip;

a plurality of inner leads expanding around said semiconductor chip, wherein a silver plating layer is formed at a wire bonding area to which said wire is joined;

a molding resin for resin sealing said semiconductor chip; and a plurality of outer leads connected to the inner leads and protruding from the molding resin, on which a lead-free metallic layer is formed on a contact surface, wherein said semiconductor device is a QFP in which the flat surface size of said molding resin is formed to be equal to or less than 28 mm×28 mm and the thickness thereof is formed to be 1.4 mm or less.

2. A semiconductor device which comprises:

a cross die pad supporting a semiconductor chip and being smaller in outer size than the surface opposite to the semiconductor die surface of said semiconductor chip;

a wire connected to a surface electrode of said semiconductor chip;

a plurality of inner leads expanding around said semiconductor chip, wherein a silver plating layer is formed at a wire bonding area to which said wire is joined;

a molding resin for resin sealing said semiconductor chip; and a plurality of outer leads connected to said inner leads and protruding from said molding resin, on which a lead-free metallic layer is formed on a contact surface, wherein said semiconductor device is one of an LQFP and a TQFP in which the flat surface size of said molding resin is formed to be equal to or less than 28 mm×28 mm.

3. A semiconductor device which comprises:

a cross die pad supporting a semiconductor chip and being smaller in outer size than the surface opposite to the semiconductor die surface of said semiconductor chip;

wires connecting to surface electrodes of the semiconductor chip;

a plurality of inner leads expanding around said semiconductor chip, on which a silver plating layer is formed at a wire bonding area to which said wire is joined;

molding resin for resin sealing said semiconductor chip; and a plurality of outer leads connected to said inner leads and protruding from said molding resin, on which a lead-free metallic layer is formed on a contact surface, wherein said semiconductor device is a QFP in which the flat surface size of said molding resin is formed to be equal to or less than 28 mm×28 mm and the thickness thereof is formed to be 1.4 mm or less.

4. A semiconductor device which comprises:

a die pad supporting a semiconductor chip and being smaller in outer size than the surface opposite to the semiconductor die surface of said semiconductor chip;

a wire connecting to a surface electrode of said semiconductor chip;

a plurality of inner leads expanding around said semiconductor chip, on which a silver plating layer is formed at a wire bonding area to which said wire is joined;

molding resin for resin sealing said semiconductor chip; and a plurality of outer leads connected to said inner leads and protruding from said molding resin, on which a lead-free metallic layer is formed on a contact surface, wherein said semiconductor device is one of a QFP, an LQFP and a TQFP, the QFP being formed such that the flat surface size of said molding resin is formed to be equal to or less than 20 mm×20 mm and the thickness thereof is formed to be 3 mm or less, and the LQFP and the TQFP being formed respectively such that the flat surface size of said molding resin is formed to be equal to or less than 20 mm×20 mm.

5. A semiconductor device which comprises:

a cross die pad supporting a semiconductor chip and being smaller in outer size than the surface opposite to the semiconductor die surface of said semiconductor chip;

a wire connecting to a surface electrode of said semiconductor chip;

a plurality of inner leads expanding around said semiconductor chip, on which a silver plating layer is formed at a wire bonding area to which said wire is joined;

molding resin for resin sealing said semiconductor chip; and a plurality of outer leads connected to said inner leads and protruding from said molding resin, on which a lead-free metallic layer is formed on a contact surface, wherein said semiconductor device is one of a QFP, an LQFP and a TQFP, the QFP being formed such that the flat surface size of said molding resin is formed to be equal to or less than 20 mm×20 mm and the thickness thereof is formed to be 3 mm or less, and the LQFP and the TQFP being formed respectively such that the flat surface size of said molding resin is formed to be equal to or less than 20 mm×20 mm.

6. A semiconductor device which comprises a QFN, said QFN including:

a die pad supporting a semiconductor chip and being smaller in outer size than the surface opposite to the semiconductor die surface of said semiconductor chip;

a wire connected to a surface electrode of said semiconductor chip;

a plurality of inner leads arranged around said semiconductor chip, on which a silver plating layer is formed at a wire bonding area to which said wire is joined;

molding resin for resin sealing said semiconductor chip; and a plurality of outer leads arranged to be exposed to a circumferential portion of a surface located in a packaging side of said molding resin, on which a lead-free metallic layer is formed on a contact surface.

7. A semiconductor device which comprises a QFN, said QFN including:

a cross die pad supporting a semiconductor chip and being smaller in outer size than the surface opposite to the semiconductor die surface of said semiconductor chip;

a wire connecting to a surface electrode of said semiconductor chip;

a plurality of inner leads arranged around said semiconductor chip, on which a silver plating layer is formed at wire bonding area to which said wire is joined;

molding resin for resin sealing said semiconductor chip; and a plurality of outer leads arranged to be exposed to a circumferential portion of a surface located in a packaging side of said molding resin, on which a lead-free metallic layer is formed on a contact surface.

8. A method of manufacturing a semiconductor device, which method comprises the steps of:

preparing a lead frame having a die pad smaller in outer size than the surface opposite to the semiconductor die surface of a semiconductor chip, a plurality of inner leads on which a silver plating layer is formed on a wire bonding area, and a plurality of outer leads which are connected to said respective inner leads and on which a lead-free metallic layer is formed on a contact surface;

mounting said semiconductor chip onto said die pad via a die bonding material;

connecting, by a wire, a surface electrode of said semiconductor chip and said silver plating layer of said wire bonding area on said inner leads corresponding to the surface electrode;

forming molding resin by resin molding said semiconductor chip such that said plurality of outer leads protrude, said lead-free metallic layer being formed on the contact surface; and separating said plurality outer leads protruding from said molding resin from a frame portion of said lead frame, wherein the flat surface size of said molding resin is formed to be equal to or less than 28 mm×28 mm, and thereby one of an LQFP and a TQFP is assembled.

9. A method of manufacturing a semiconductor device, which method comprises the steps of:

preparing a lead frame having a die pad smaller in outer size than the surface opposite to the semiconductor die surface of a semiconductor chip, a plurality of inner leads on which a silver plating layer is formed on a wire bonding area, and a plurality of outer leads which are connected to said respective inner leads and on which a lead-free metallic layer is formed on a contact surface;

mounting said semiconductor chip onto said die pad via a die bonding material;

connecting, by a wire, a surface electrode of said semiconductor chip and said silver plating layer of said wire bonding area on said inner leads corresponding to the surface electrode;

forming molding resin by resin molding said semiconductor chip such that said plurality of outer leads protrude in which said lead-free metallic layer being formed on the contact surface; and separating said plurality of outer leads protruding from said molding resin from a frame portion of said lead frame, whereby one of a QFP, an LQFP and a TQFP is assembled, the QFP being forming such that the flat surface size of said molding resin is equal to or less than 20 mm×20 mm and the thickness thereof is 3 mm or less, and the LQFP and the TQFP being formed such that the flat surface size of the molding resin is equal to or less than 20 mm×20 mm.

10. A method of manufacturing a semiconductor device, which method comprises the steps of:

preparing a lead frame having a die pad smaller in outer size than the surface opposite to the semiconductor die surface of a semiconductor chip, a plurality of inner lead portions on which a silver plating layer is formed at a wire bonding area, and a plurality of outer lead portions on which a lead-free metallic layer is formed on a contact surface continuing on said inner lead portions;

mounting said semiconductor chip onto said die pad via a die bonding material;

connecting, by a wire, a surface electrode of said semiconductor chip and said silver plating layer of said wire bonding area on said inner lead portions corresponding to the surface electrode;

forming molding resin by resin molding said semiconductor chip such that said lead-free metallic layer of each of said plurality of outer lead portions is exposed to a circumferential portion thereof; and separating said plurality of outer lead portions from a frame portion of said lead frame, whereby a QFN is assembled.

11. A method of manufacturing a semiconductor device, which method comprises the steps of:

preparing a lead frame having a cross die pad smaller in outer size than the surface opposite to the semiconductor die surface of a semiconductor chip, a plurality of inner leads on which a silver plating layer is formed on a wire bonding area, and a plurality of outer leads which are connected to said respective inner leads and on which a lead-free metallic layer is formed on a contact surface;

mounting said semiconductor chip onto said die pad via a die bonding material;

connecting, by a wire, a surface electrode of said semiconductor chip and said silver plating layer of said wire bonding area on said inner leads corresponding to the surface electrode;

forming molding resin by resin molding said semiconductor chip such that said plurality of outer leads protrude, said lead-free metallic layer being formed on the contact surface; and separating said plurality of outer leads protruding from said molding resin from a frame portion of said lead frame, wherein the flat surface size of said molding resin is formed to be equal to or less than 28 mm×28 mm, and thereby one of an LQFP and a TQFP is assembled.

12. A method of manufacturing a semiconductor device, which method comprises the steps of:

preparing a lead frame having a cross die pad smaller in outer size than the surface opposite to the semiconductor die surface of a semiconductor chip, a plurality of inner leads on which a silver plating layer is formed on a wire bonding area, and a plurality of outer leads which are connected to said inner leads and on which a lead-free metallic layer is formed on a contact surface;

mounting said semiconductor chip onto said cross die pad via a die bonding material;

connecting, by a wire, a surface electrode of said semiconductor chip and said silver plating layer of said wire bonding area on said inner leads corresponding to the surface electrode;

forming molding resin by resin molding said semiconductor chip such that said plurality of outer leads protrude in which said lead-free metallic layer being formed on the contact surface; and separating said plurality of outer leads protruding from said molding resin from a frame portion of said lead frame;

whereby one of a QFP, an LQFP and a TQFP is assembled, the QFP being forming such that the flat surface size of said molding resin is equal to or less than 20 mm×20 mm and the thickness thereof is 3 mm or less, and the LQFP and the TQFP being formed such that the flat surface size of the molding resin is equal to or less than 20 mm×20 mm.

13. A method of manufacturing a semiconductor device, which method comprises the steps of:

preparing a lead frame having a cross die pad smaller in outer size than the surface opposite to the semiconductor die surface of a semiconductor chip, a plurality of inner lead portions on which a silver plating layer is formed at a wire bonding area, and a plurality of outer lead portions which are continued to said respective inner leads and on which a lead-free metallic layer is formed on a contact surface;

mounting said semiconductor chip onto said cross die pad via a die bonding material;

connecting, by a wire, a surface electrode of said semiconductor chip and said silver plating layer of said wire bonding area on said inner lead portions corresponding to the surface electrode;

forming molding resin by resin molding said semiconductor chip such that said lead-free metallic layer of each of said plurality of outer lead portions is exposed to a circumferential portion thereof; and separating said plurality of outer lead portions from a frame portion of said lead frame, whereby a QFN is assembled.

14. A method of manufacturing a semiconductor device, which method comprises the steps of:

preparing a lead frame having a die pad smaller in outer size than the surface opposite to the semiconductor die surface of a semiconductor chip, a plurality of inner leads on which a silver plating layer is formed at a wire bonding area, and a plurality of outer leads connected to said respective inner leads;

mounting said semiconductor chip onto said die pad via a die bonding material;

connecting, by a wire, a surface electrode of said semiconductor chip and said silver plating layer of said wire bonding area on said inner leads corresponding to the surface electrode;

forming molding resin by resin molding said semiconductor chip such that said plurality of outer leads protrude;

forming a lead-free metallic layer on a contact surface of said plurality of outer leads protruding from said molding resin; and separating said plurality of outer leads from a frame portion of said lead frame, wherein the flat surface size of said molding resin is formed to be equal to or less than 28 mm×28 mm, and thereby one of an LQFP and a TQFP is assembled.

15. A method of manufacturing a semiconductor device, which method comprises the steps of:

preparing a lead frame having a die pad smaller in outer size than the surface opposite to the semiconductor die surface of a semiconductor chip, a plurality of inner leads on which a silver plating layer is formed at a wire bonding area, and a plurality of outer leads connected to said inner leads;

mounting said semiconductor chip onto said die pad via a die bonding material;

connecting, by a wire, surface electrodes of said semiconductor chip and said silver plating layer of said wire bonding area on said inner leads corresponding to the surface electrode;

forming molding resin by resin molding said semiconductor chip such that said plurality of outer leads protrude;

forming a lead-free metallic layer on a contact surface of each of said plurality of outer leads protruding from said molding resin; and separating said plurality of outer leads from a frame portion of said lead frame;

whereby one of a QFP, an LQFP and a TQFP is assembled, the QFP being formed such that the flat surface size of said molding resin is equal to or less than 20 mm×20 mm and the thickness thereof is 3 mm or less, and the LQFP and the TQFP being formed respectively such that the flat surface size of said molding resin is equal to or less than 20 mm×20 mm.

16. A method of manufacturing a semiconductor device, which method comprises the steps of:

preparing a lead frame having a die pad smaller in outer size than the surface opposite to the semiconductor die surface of a semiconductor chip, a plurality of inner lead portions on which a silver plating layer is formed at wire bonding area, and a plurality of outer lead portions connected to said inner leads;

mounting said semiconductor chip onto said die pad via a die bonding material;

connecting, by a wire, a surface electrode of said semiconductor chip and said silver plating layer of said wire bonding area on said inner lead portions corresponding to the surface electrode;

forming molding resin by resin molding said semiconductor chip such that said plurality of outer lead portions are exposed to a circumferential portion of a surface located in a packaging side;

forming a lead-free metallic layer on the contact surface of said plurality of outer lead portions exposed to said molding resin; and separating said plurality of outer lead portions from a frame portion of said lead frame, whereby a QFN is assembled.

17. A method of manufacturing a semiconductor device, which method comprises the steps of:

preparing a lead frame having a cross die pad smaller in outer size than the surface opposite to the semiconductor die surface of a semiconductor chip, a plurality of inner leads on which a silver plating layer is formed at a wire bonding area, and a plurality of outer leads connected to said respective inner leads;

mounting said semiconductor chip onto said die pad via a die bonding material;

connecting, by a wire, a surface electrode of said semiconductor chip and said silver plating layer of said wire bonding area on said inner leads corresponding to the surface electrode;

forming molding resin by resin molding said semiconductor chip such that said plurality of outer leads protrude;

forming a lead-free metallic layer on each contact surface of said plurality of outer lead portions protruding from said molding resin; and separating said plurality of outer leads from a frame portion of said lead frame, wherein the flat surface size of said molding resin is formed to be equal to or less than 28 mm×28 mm, and thereby one of an LQFP and a TQFP is assembled.

18. A method of manufacturing a semiconductor device, which method comprises the steps of:

preparing a lead frame having a cross die pad smaller in outer size than the surface opposite to the semiconductor die surface of a semiconductor chip, a plurality of inner leads on which a silver plating layer is formed at a wire bonding area, and a plurality of outer leads connected to said respective inner leads;

mounting said semiconductor chip onto said cross die pad via a die bonding material;

connecting, by a wire, a surface electrode of said semiconductor chip and said silver plating layer of said wire bonding area on said inner leads corresponding to the surface electrode;

forming molding resin by resin molding said semiconductor chip such that said plurality of outer leads protrude;

forming a lead-free metallic layer on each contact surface of said plurality outer lead portions protruding from said molding resin; and separating said plurality of outer leads from a frame portion of said lead frame, whereby one of a QFP, an LQFP and a TQFP is assembled, the QFP being formed such that the flat surface size of said molding resin is equal to or less than 20 mm×20 mm and the thickness thereof is 3 mm or less, and the LQFP and the TQFP being formed respectively such that the flat surface size of said molding resin is equal to or less than 20 mm×20 mm.

19. A method of manufacturing a semiconductor device, comprises the steps of:

preparing a lead frame having a cross die pad smaller in outer size than the surface opposite to the semiconductor die surface of a semiconductor chip, a plurality of inner lead portions on which a silver plating layer is formed at a wire bonding area, and a plurality of outer lead portions connected to said inner lead portions;

mounting said semiconductor chip onto said cross die pad via a die bonding material;

connecting, by a wire, surface electrodes of said semiconductor chip and said silver plating layer of said wire bonding area on said inner lead portions corresponding to the surface electrode;

forming molding resin by resin molding said semiconductor chip such that said plurality of outer lead portions are exposed to a circumferential portion of a surface located in a packaging side;

forming a lead-free metallic layer on each contact surface of said plurality of outer lead portions exposed to said molding resin; and separating said plurality of outer lead portions from a frame portion of said lead frame, whereby a QFN is assembled.

BRIEF DESCRIPTION OF THE DRAWINGS

FIG. 19 is a relational view showing relations between each semiconductor device and molding resin thickness in the embodiment of the present invention.

FIG. 20 is a comparative view showing a technical concept of the semiconductor device according to the embodiment of the present invention.

DESCRIPTION OF THE PREFERRED EMBODIMENTS

In the embodiments described below, the invention will be described in a plurality of sections or embodiments when required as a matter of convenience. However, these sections or embodiments are not irrelevant to each other unless otherwise stated, and each one relates to the all or at least part of the other sections or embodiments as a modification example, detail, supplementary explanation or the like thereof.

Also, in the embodiments described below, when referring to the number of elements (including number of pieces, values, amounts, ranges, or the like), the number of elements is not limited to a specific number unless otherwise stated, except in a case where the number is apparently limited to a specific number in principle, or the like. Thus, numbers larger or smaller than the specified number are also applicable.

Further, in the embodiments described below, it goes without saying that the components (including element steps or the like) are not always essential unless otherwise stated, except in a case where the components are apparently essential in principle, or the like.

Similarly, in the embodiments described below, when the shape of the components and the like, or the positional relation and the like thereof, or the like are mentioned, substantially approximate and similar shapes and the like are included therein unless otherwise stated, except in a case where it can be conceived that they are apparently excluded in principle, or the like. This condition is also applicable to the numerical value and the range described above.

The embodiments of the present invention will be described hereinafter in detail with reference to the drawings.

Also, components having the same functions are denoted by the same reference symbols throughout the drawings for describing the embodiments, and the repetitive description thereof will be omitted.

Figure 1:
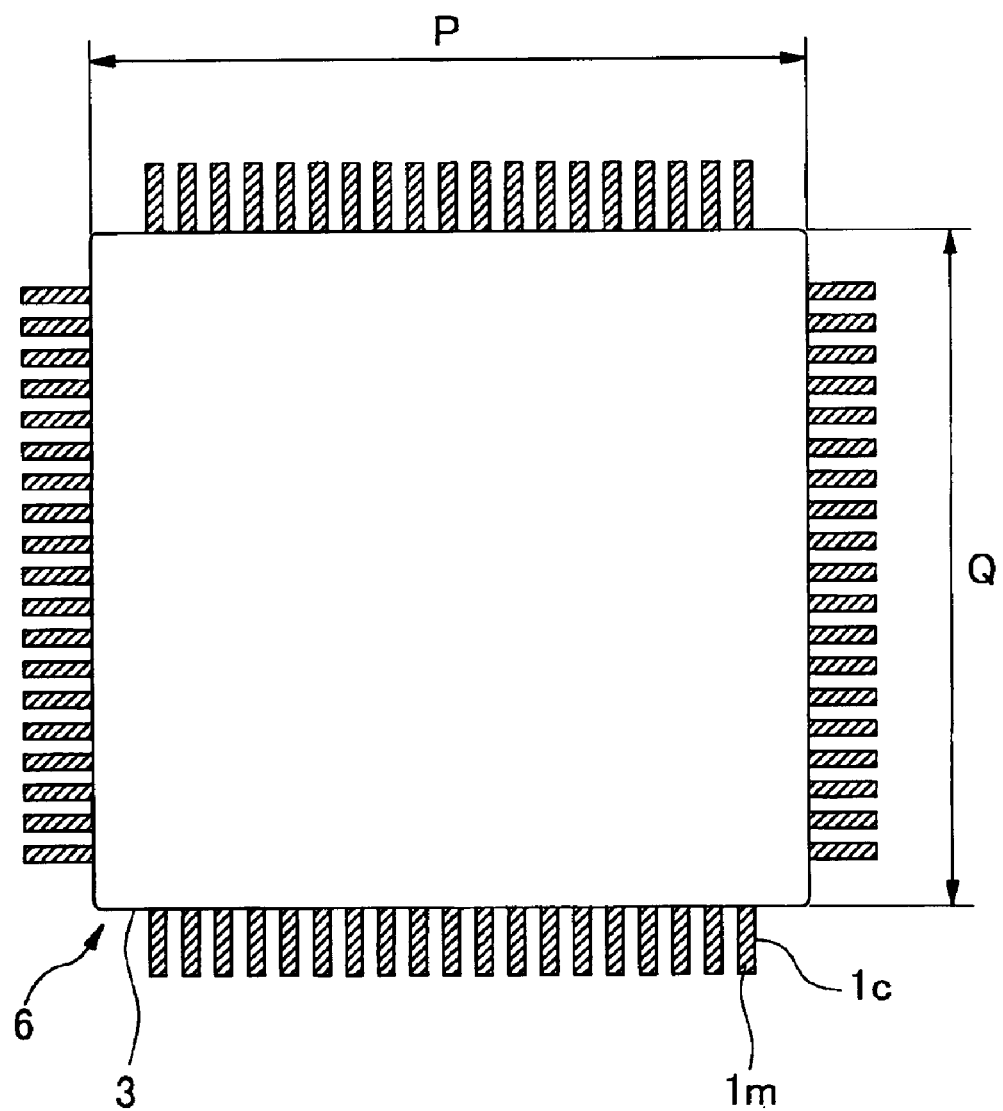
FIG. 1 is a plan view showing the structure of a QFP serving as one example of a semiconductor device that is an embodiment of the present invention.
Figure 2:
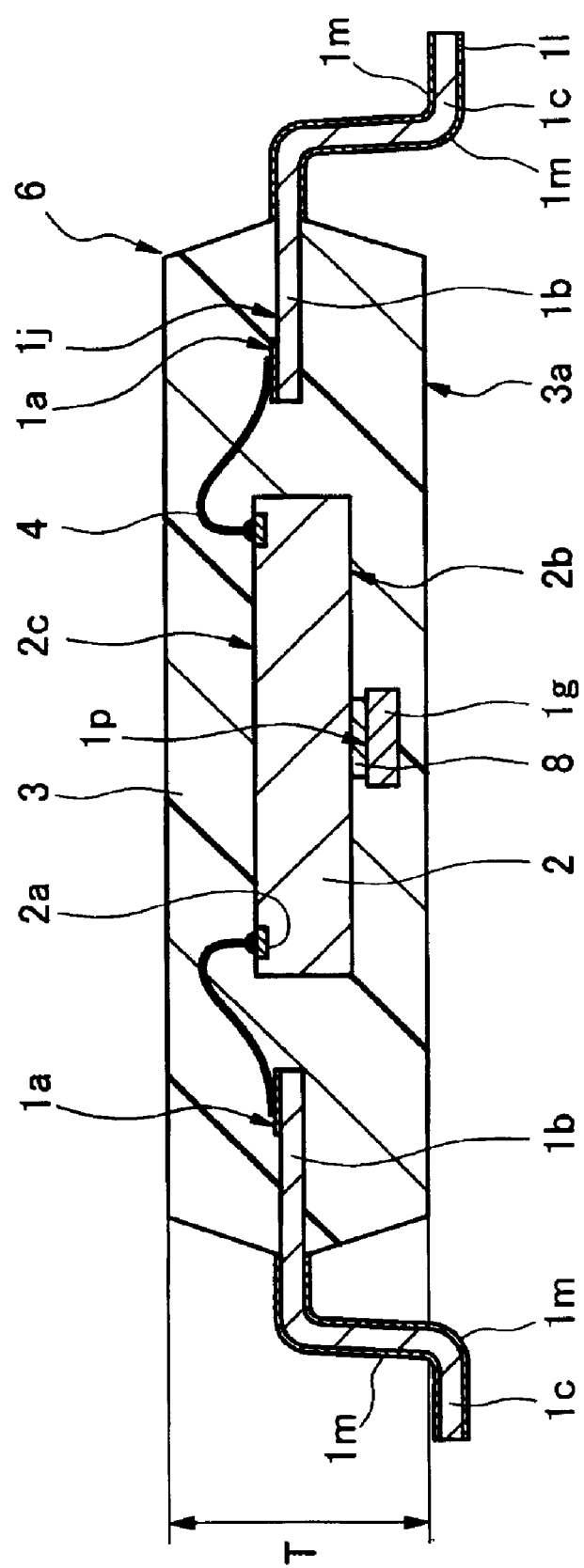
FIG. 2 is a cross-sectional view showing the structure of the QFP shown in FIG. 1.
Figure 3:
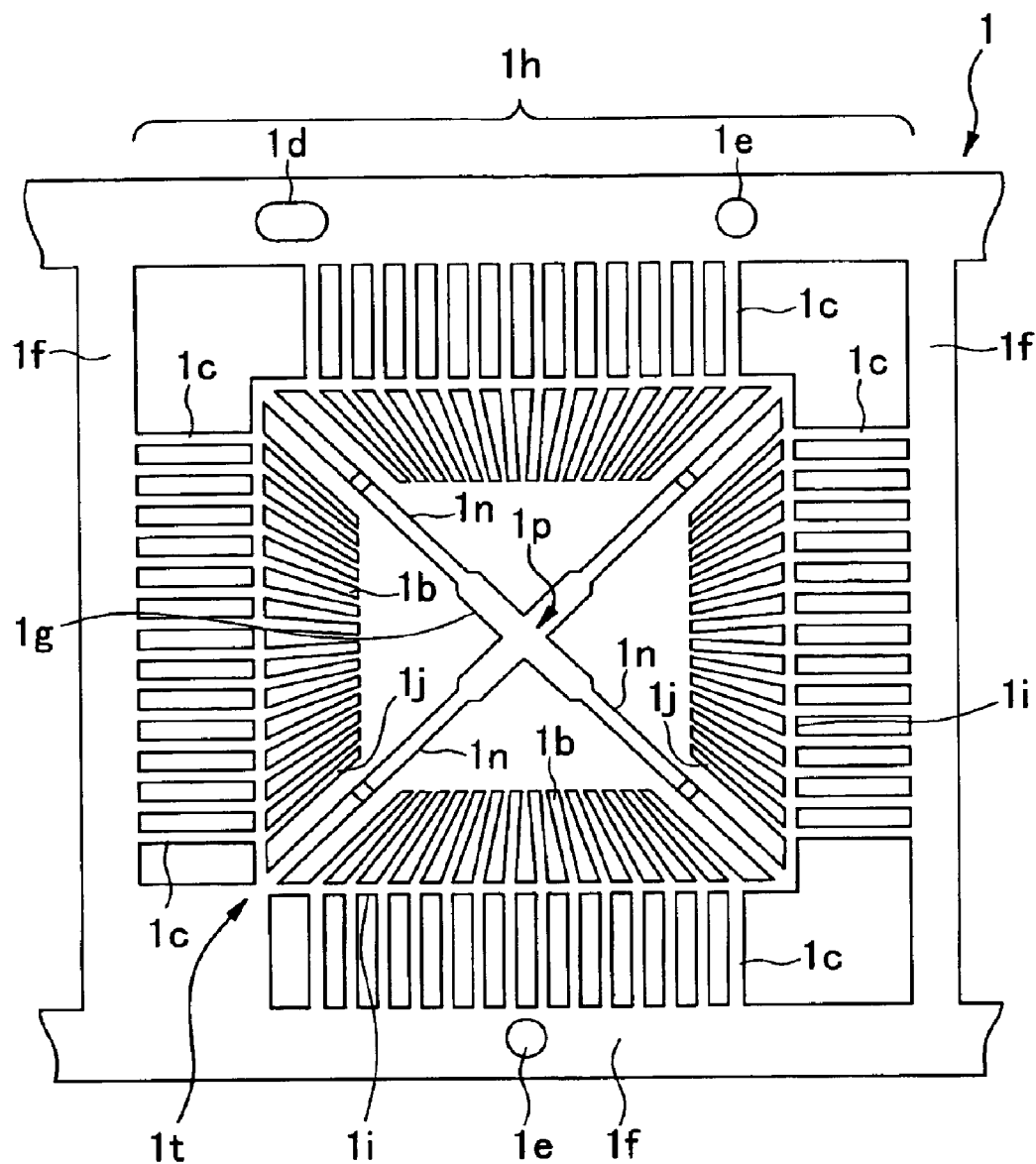
FIG. 3 is a partial plan view showing one example of the structure of a lead frame used in assembly of the QFP shown in FIG. 1.
Figure 4:
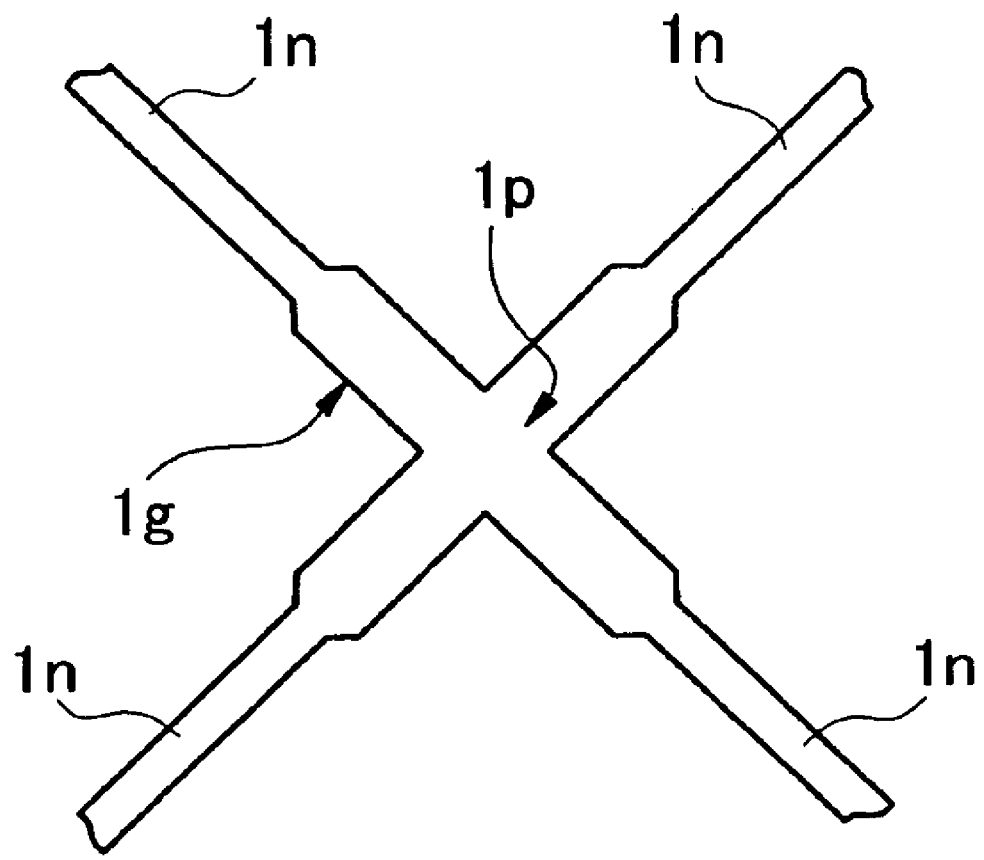
FIG. 4 is a partially enlarged plan view showing the structure of a cross die pad serving as a semiconductor chip mounting portion of the lead frame shown in FIG. 3.
Figure 5:
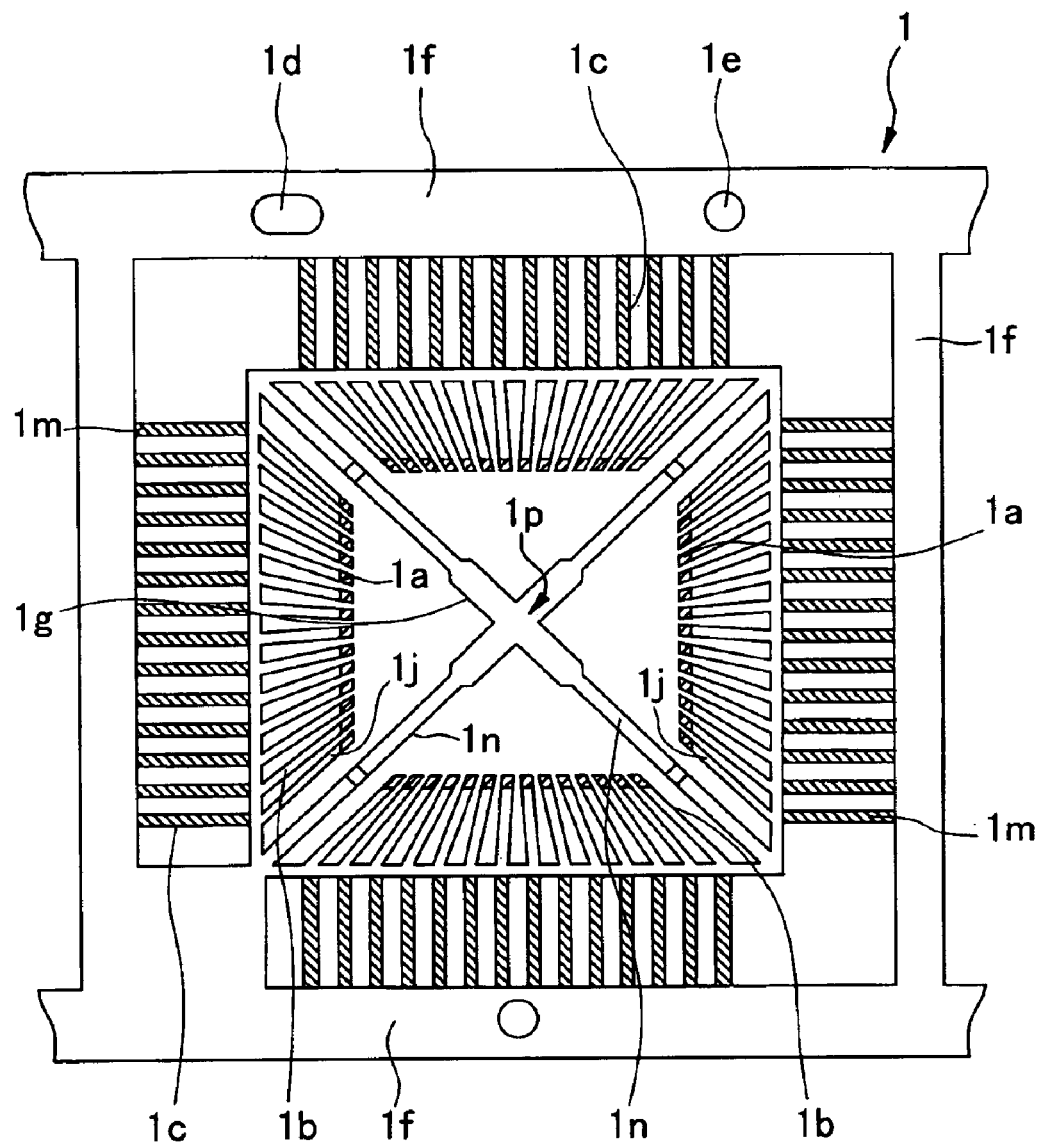
FIG. 5 is a partial plan view showing one example of the structure in which a silver plating layer and an exterior plating layer are formed on the lead frame shown in FIG. 3.
Figure 6:
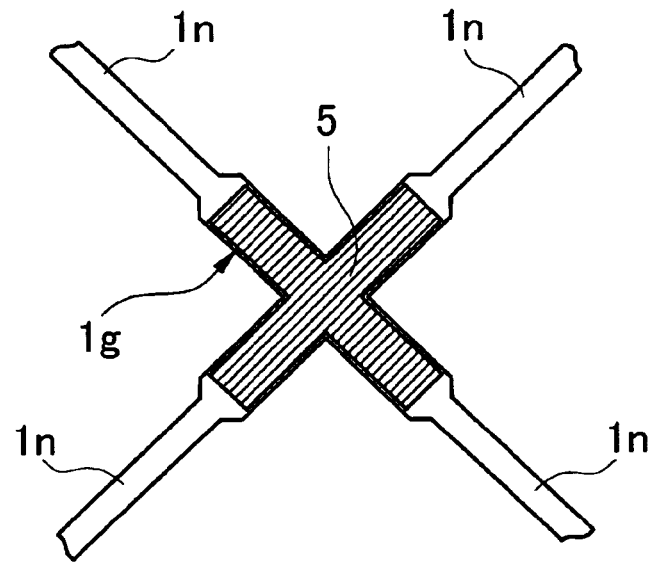
FIG. 6 is a partially enlarged plan view showing one example of the structure obtained at the time when a double-sided adhesive tape is attached to the cross die pad shown in FIG. 4.
Figure 7:
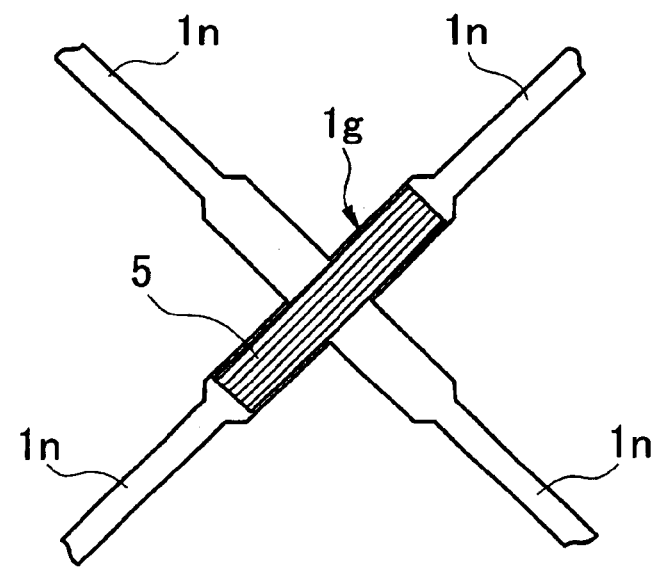
FIG. 7 is a partially enlarged plan view showing a structure obtained when a double-sided adhesive tape that is a modification of the double-sided adhesive tape shown in FIG. 6 is attached.
Figure 8:
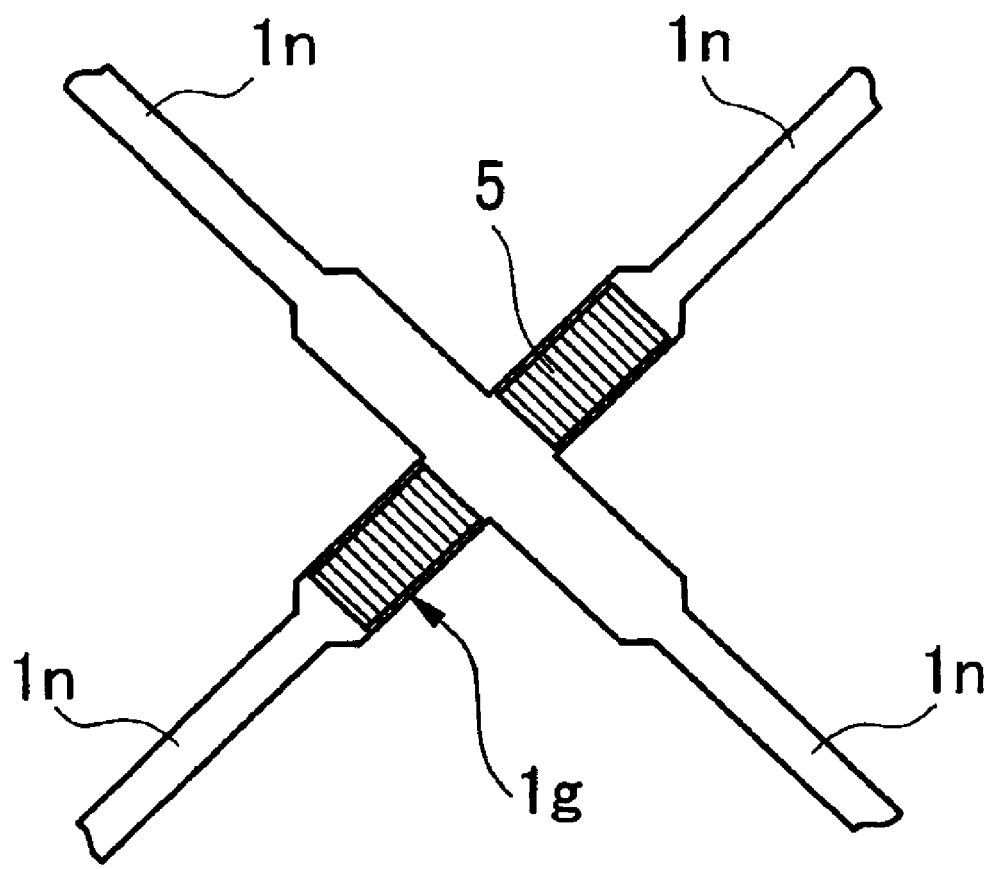
FIG. 8 is a partially enlarged plan view showing a structure obtained when a double-sided adhesive tape that is a modification of the double-sided adhesive tape shown in FIG. 6 is attached.
Figure 9:
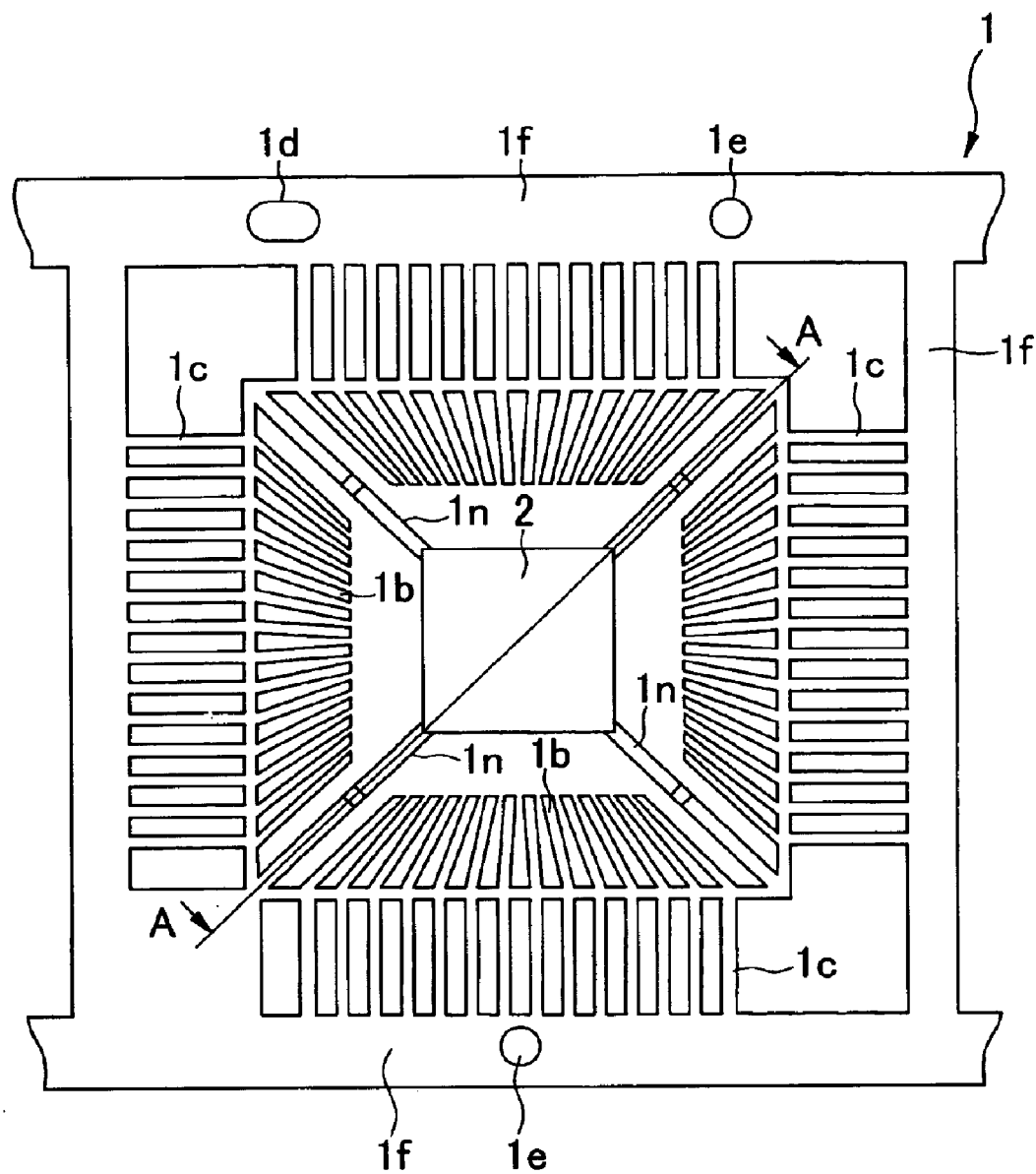
FIG. 9 is a partial plan view showing the structure obtained after die bonding in the assembly of the QFP shown in FIG. 1.
Figure 10:
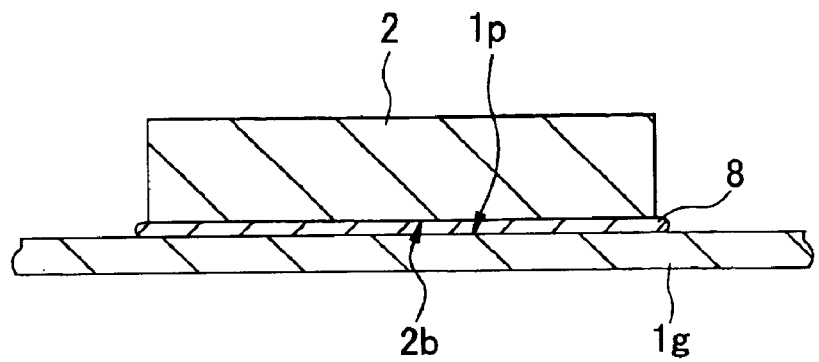
FIG. 10 is a partially enlarged cross-sectional view showing a sectional structure taken along line A—A shown in FIG. 9.
Figure 11:
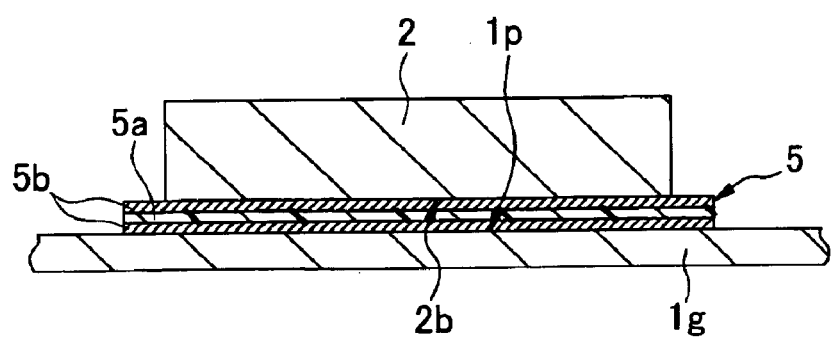
FIG. 11 is a partially enlarged cross-sectional view showing the structure of a die bonding condition using a double-sided adhesive tape that is a modification, relative to the die bonding condition shown in FIG. 10.
Figure 12:
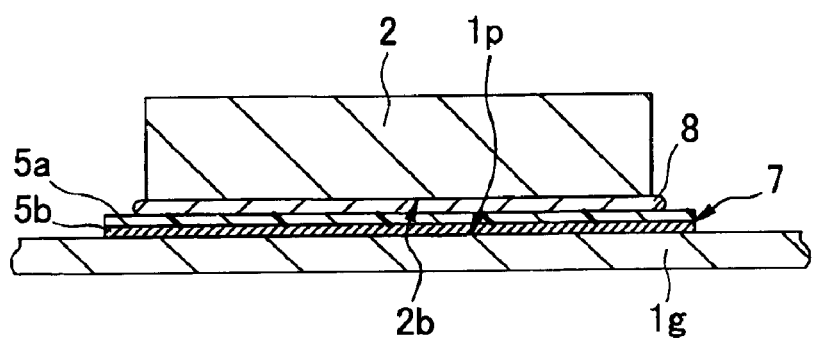
FIG. 12 is a partially enlarged cross sectional view showing the structure of a die bonding condition using molding resin paste and a single-sided adhesive tape modified, relative to the die bonding condition shown in FIG. 10.
Figure 13:
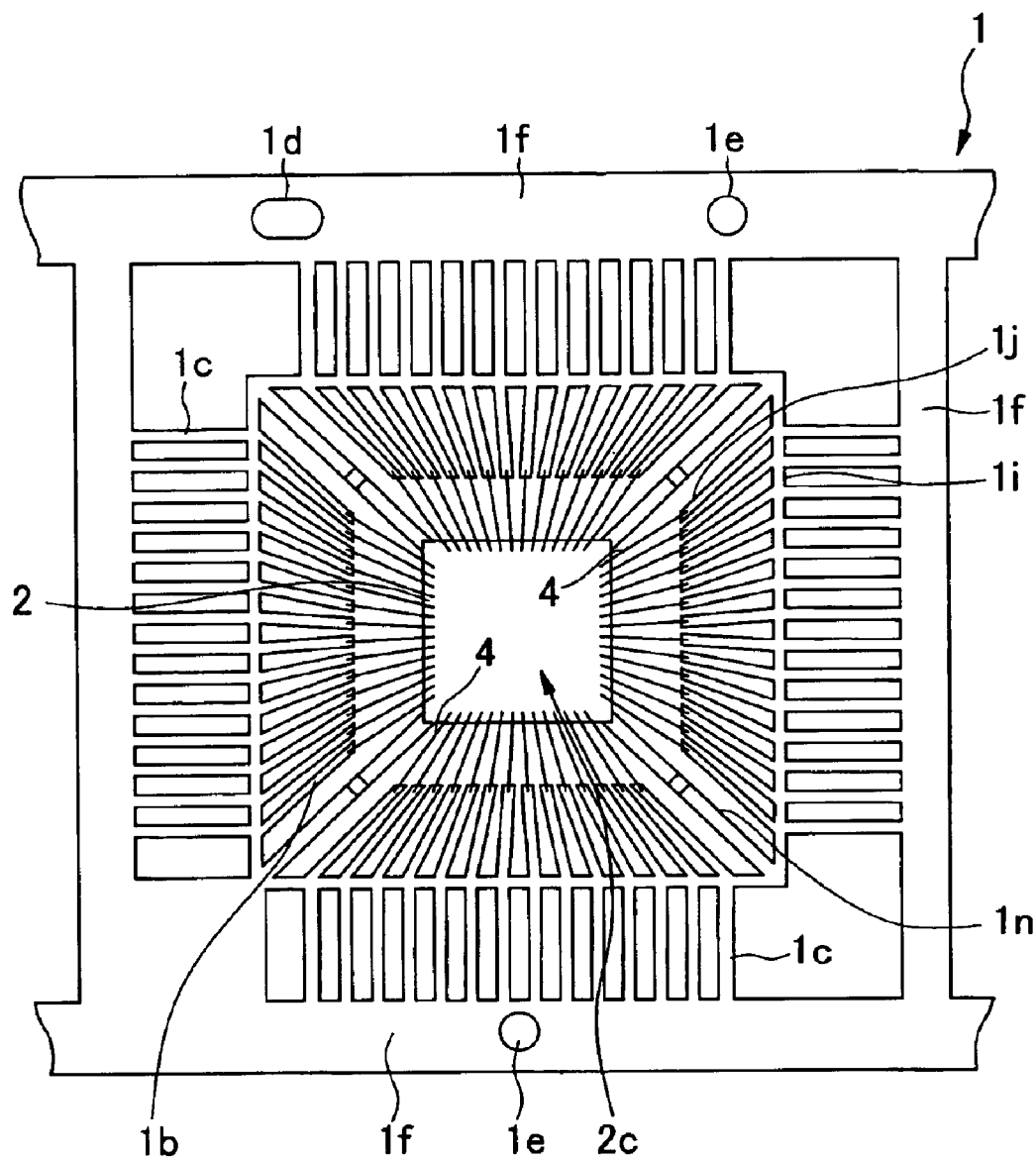
FIG. 13 is a partial plan view showing the structure obtained after wire bonding in the assembly of the QFP shown in FIG. 1.
Figure 14:
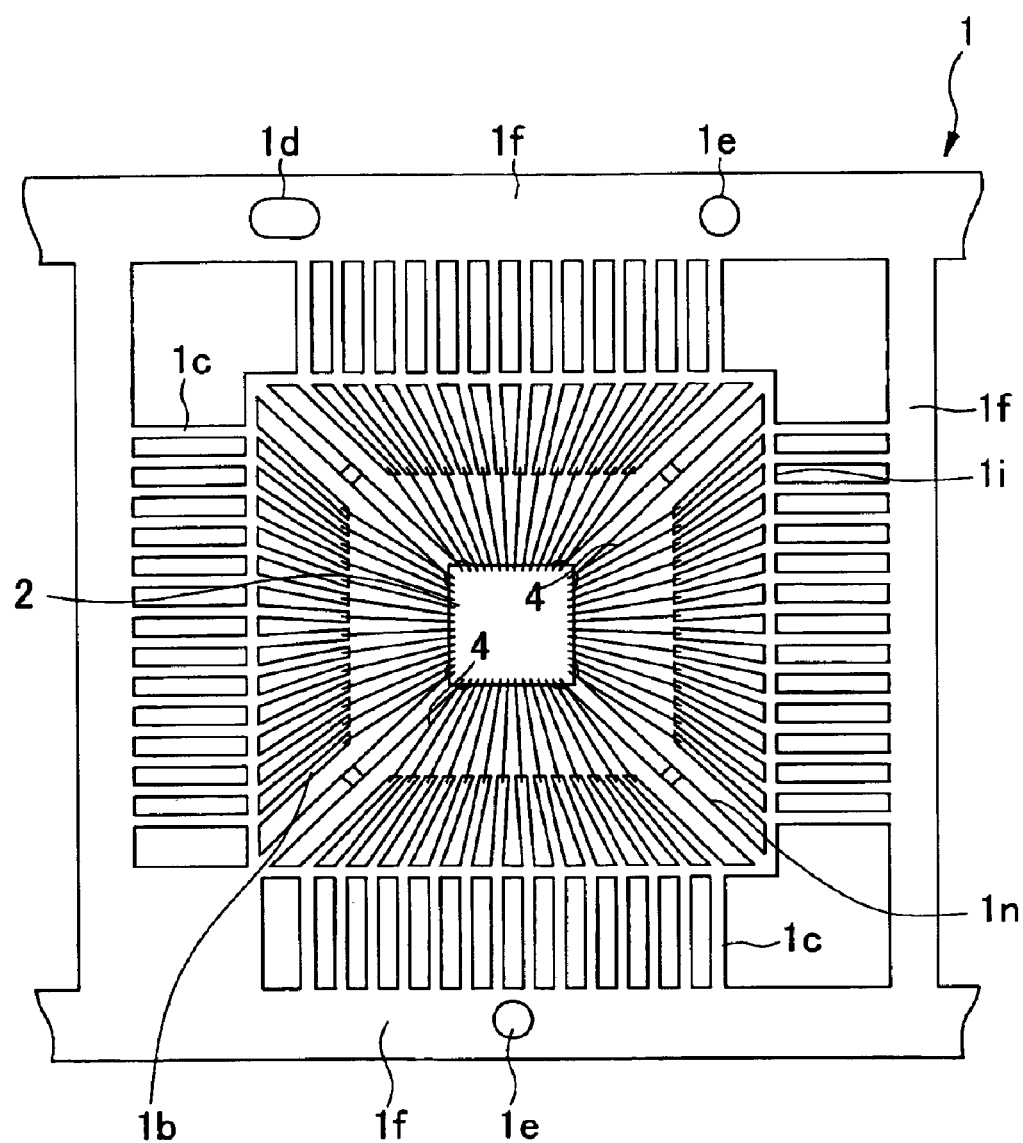
FIG. 14 is a partial plan view showing the structure obtained after wire bonding in the assembly using a small size semiconductor chip relative to the lead frame shown in FIG. 13.
Figure 15:
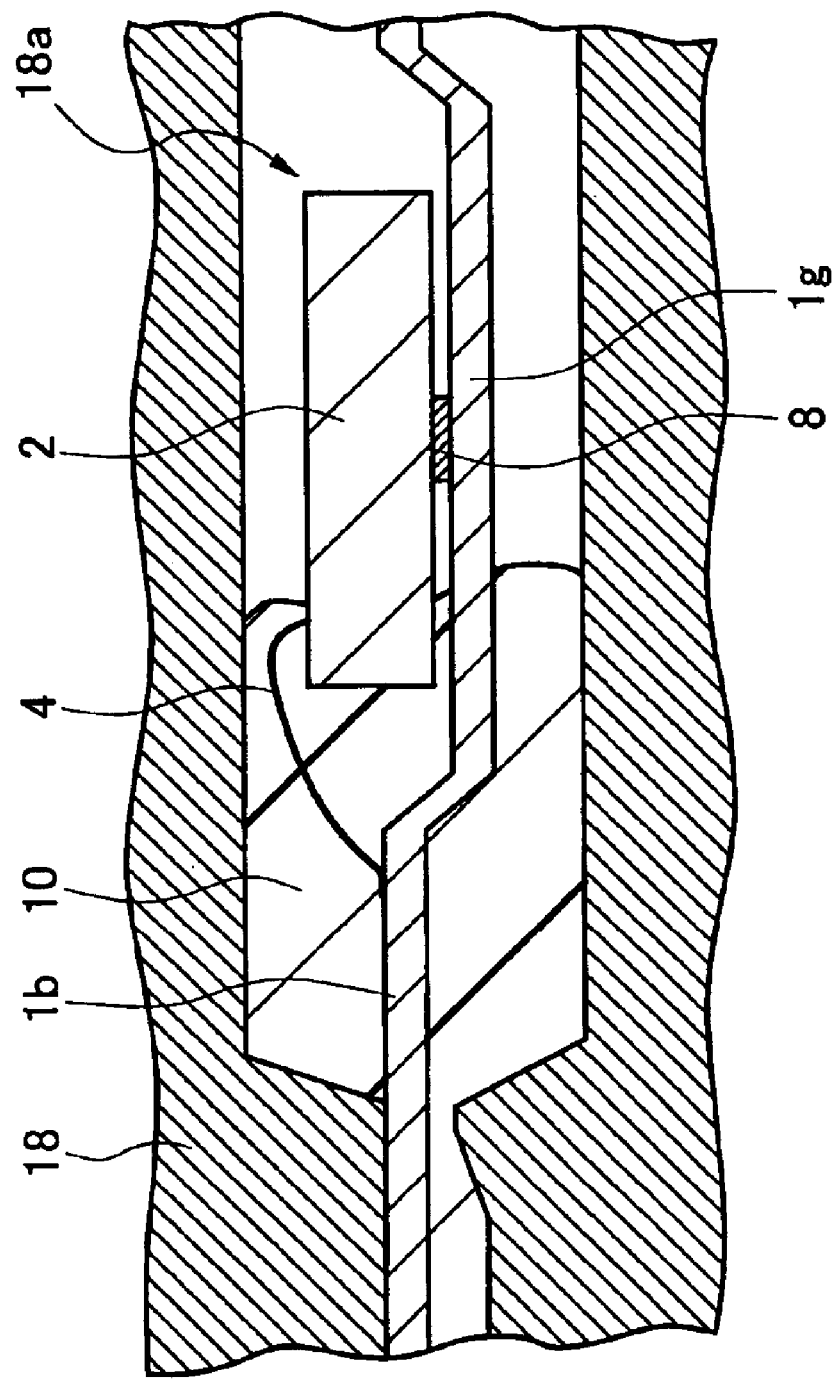
FIG. 15 is a partial cross-sectional view showing one example of the structure obtained by resin molding in the assembly of the QFP shown in FIG. 1.
Figure 16:
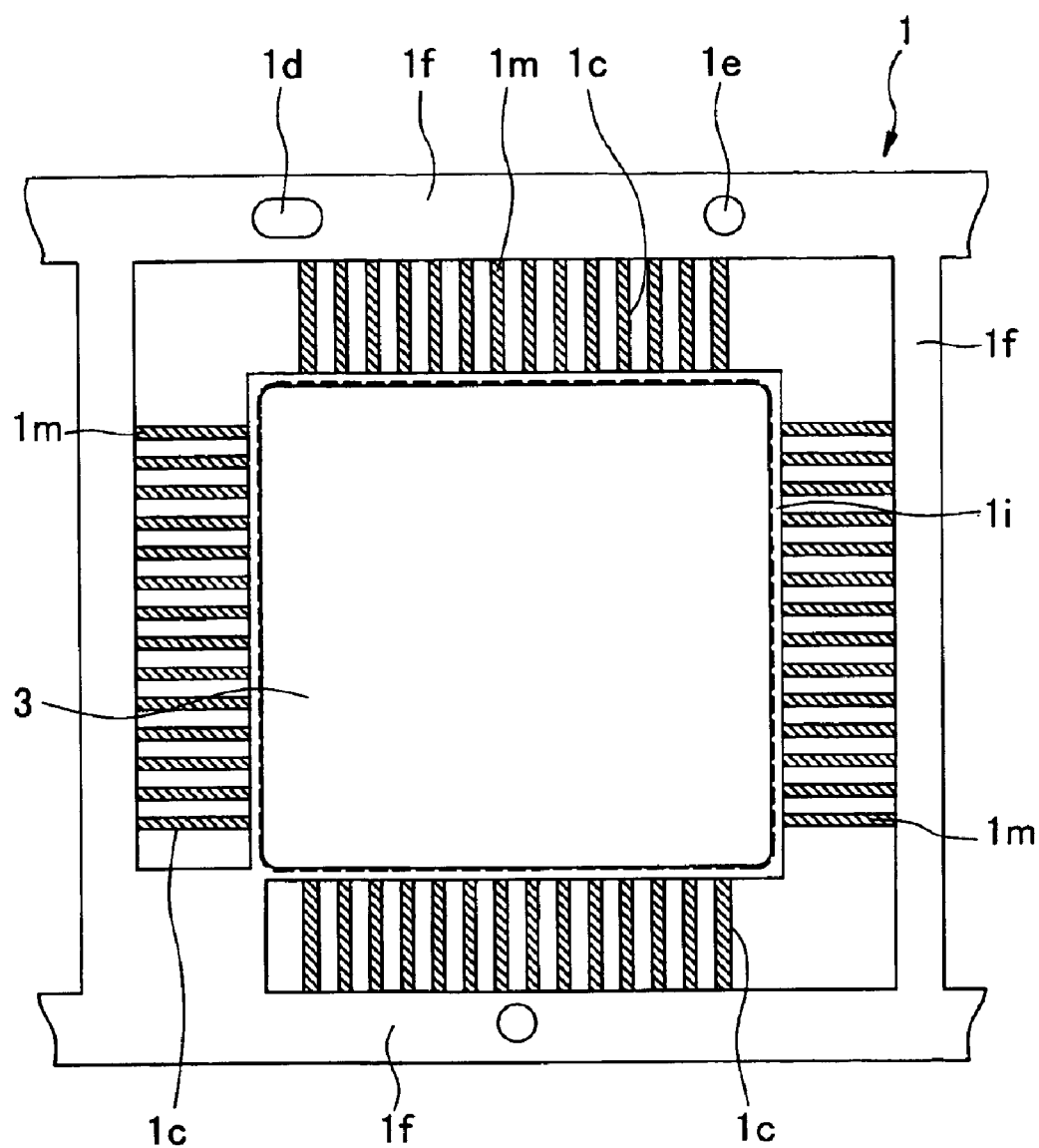
FIG. 16 is a partial plan view showing one example of the structure obtained after resin molding in the assembly of the QFP shown in FIG. 1.
Figure 17:
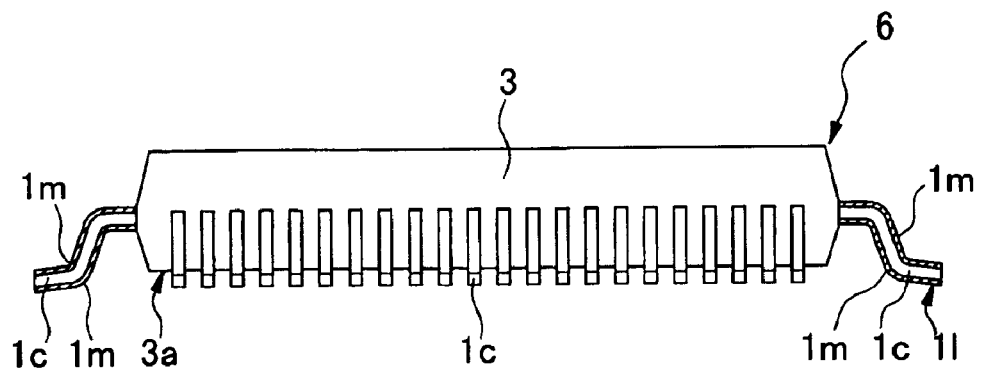
FIG. 17 is a side view showing one example of the structure after cutting and formation in the assembly of the QFP shown in FIG. 1.
Figure 18:
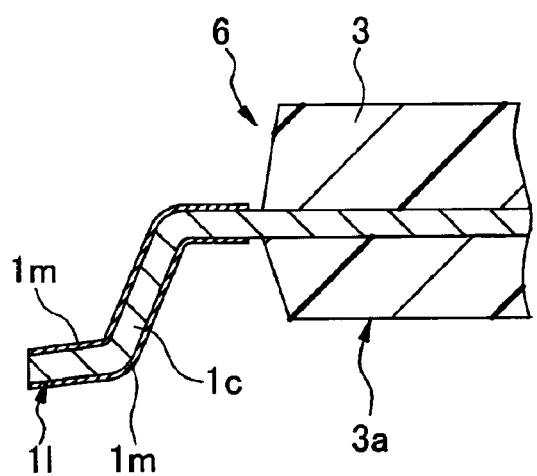
FIG. 18 is a partially enlarged cross-sectional view showing one example of the structure obtained at the time when exterior plating of an outer lead of the QFP is carried out after resin molding.
Figure 21:
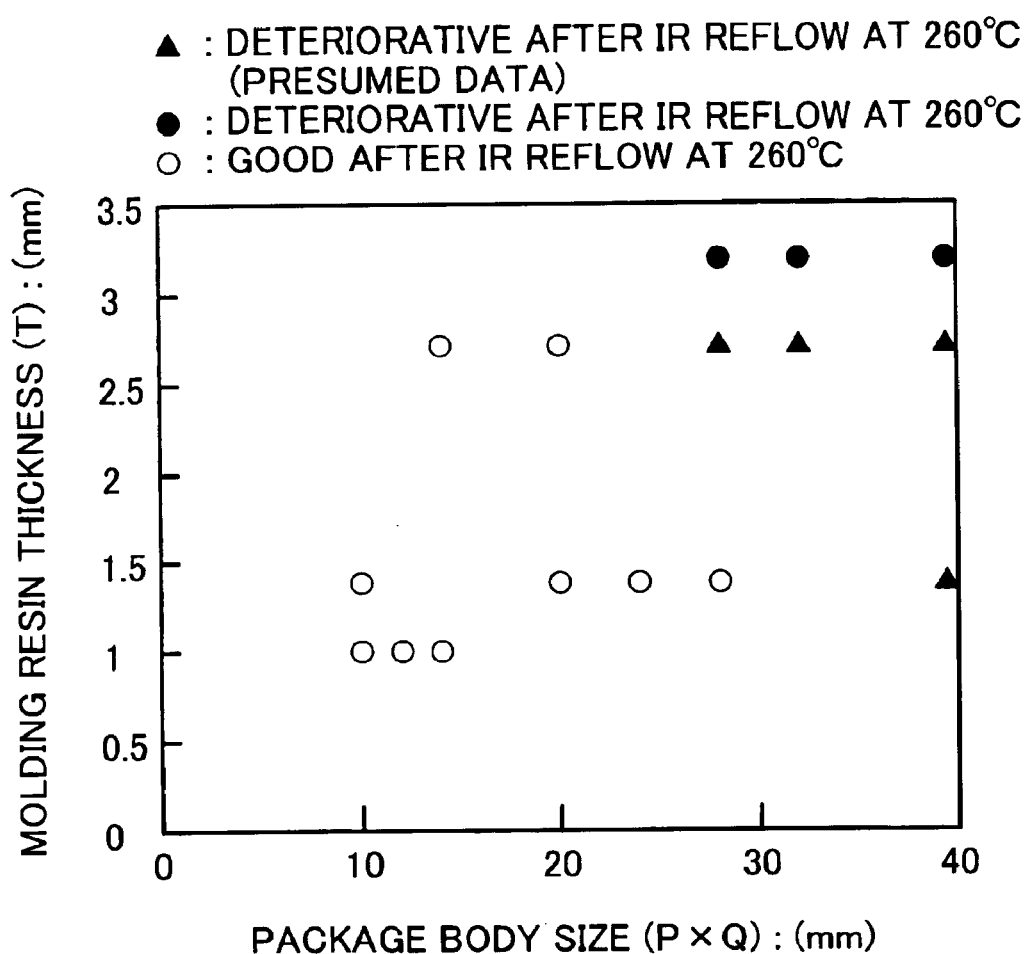
FIG. 21 is a diagram showing the results of wire crack inspection relative to the size and thickness of a molding resin portion in the semiconductor device according to the embodiment of the present invention.
Figure 22:
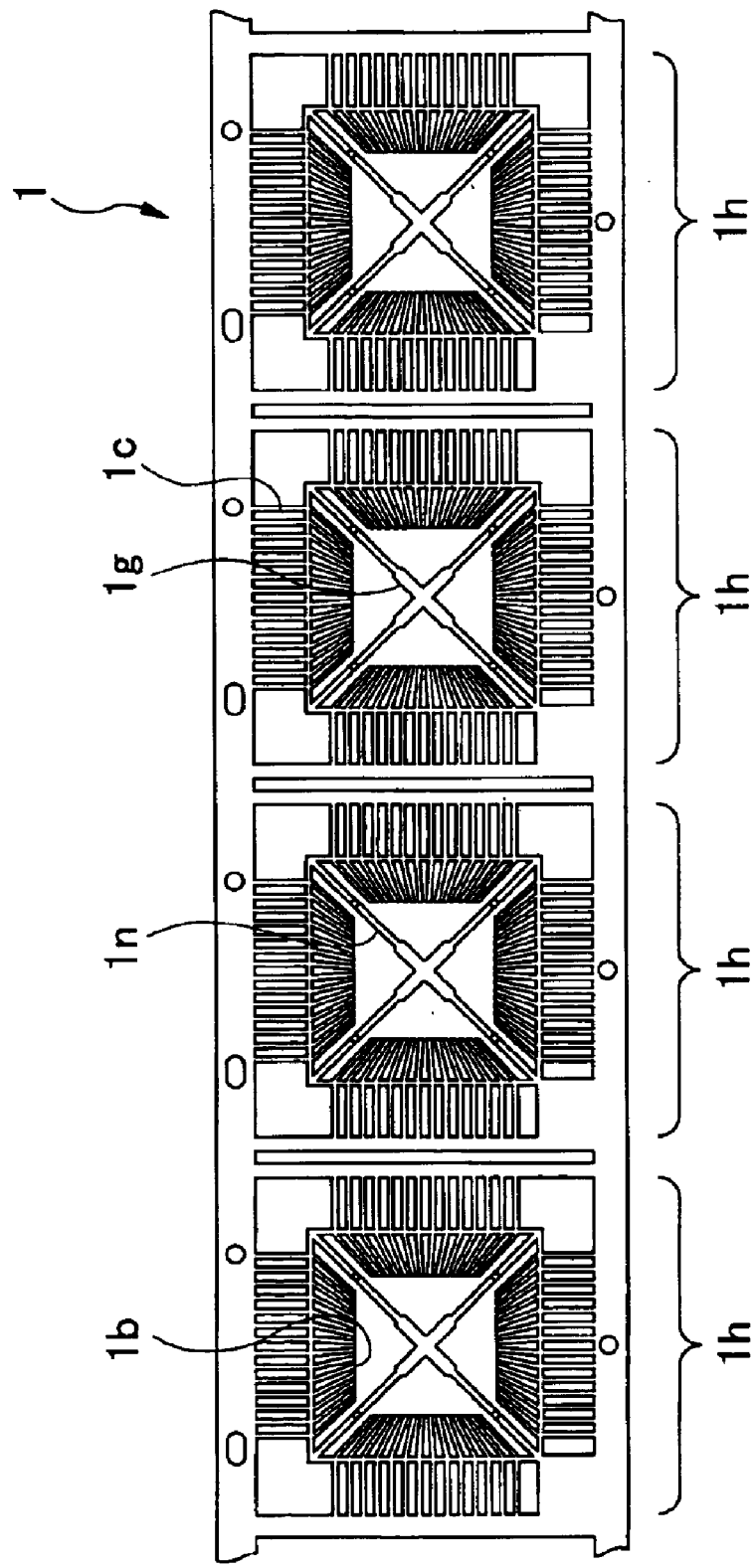
FIG. 22 is a partial plan view showing one example of the structure of a multiple lead frame used in the assembly of the QFP shown in FIG. 1.
Figure 23:
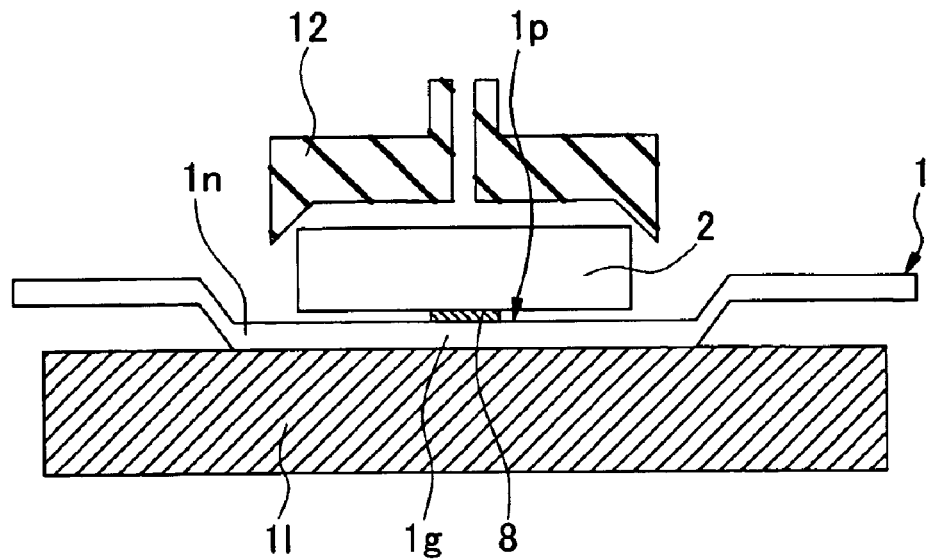
FIG. 23 is a partial cross-sectional view showing one example of the structure obtained by die bonding in the assembly of the QFP shown in FIG. 1.
Figure 24:
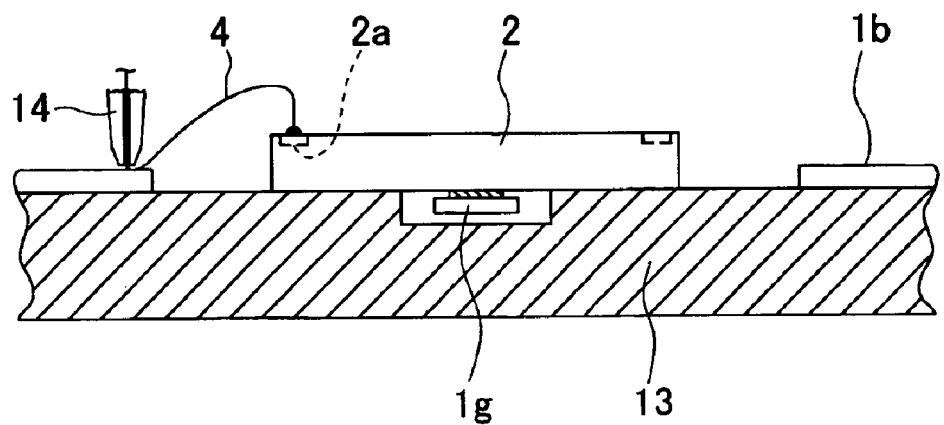
FIG. 24 is a partial cross sectional view showing one example of the structure obtained by wire bonding in the assembly of the QFP shown in FIG. 1.
Figure 25:
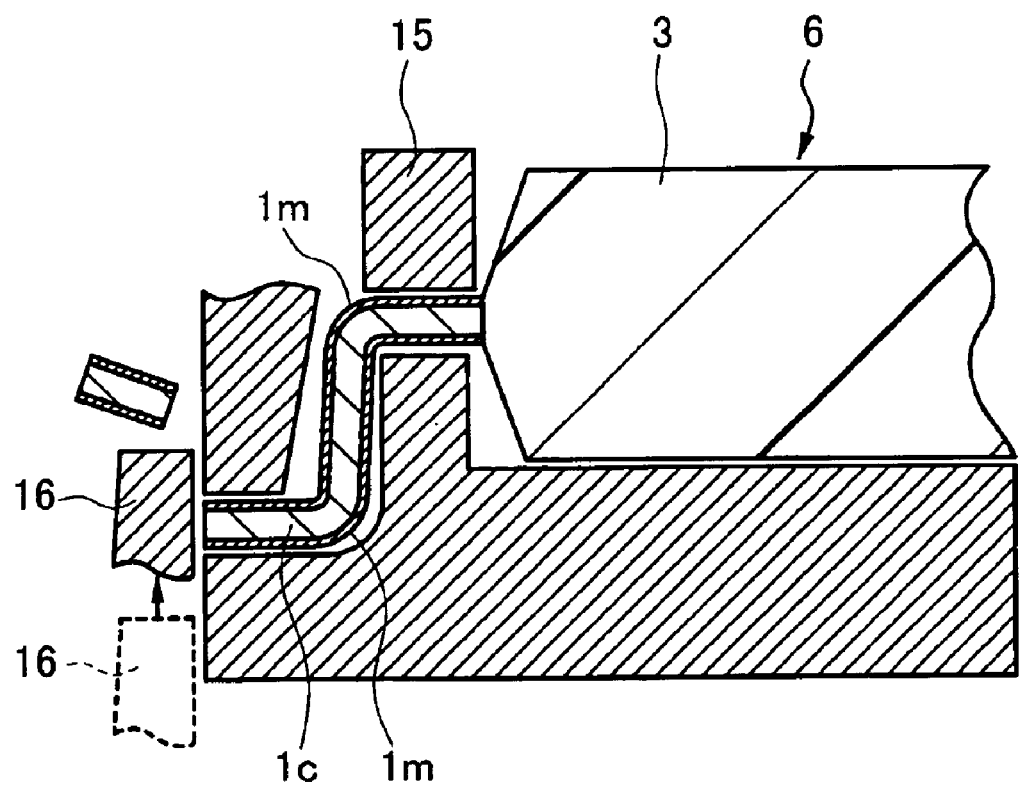
FIG. 25 is a partial cross-sectional view showing one example of the structure obtained by cutting and formation in the assembly of the QFP shown in FIG. 1.

FIG. 1 is a plan view showing the structure of a QFP serving as one example of a semiconductor device that is an embodiment of the present invention; FIG. 2 is a cross-sectional view showing the structure of the QFP shown in FIG. 1; FIG. 3 is a partial plan view showing one example of the structure of a lead frame used in assembly of the QFP shown in FIG. 1; FIG. 4 is a partially enlarged plan view showing the structure of a cross die pad serving as a semiconductor chip mounting portion of the lead frame shown in FIG. 3; FIG. 5 is a partial plan view showing one example of the structure in which a silver plating layer and an exterior plating layer are formed on the lead frame shown in FIG. 3; FIG. 6 is a partially enlarged plan view showing one example of the structure obtained at the time when a double-sided adhesive tape is attached to the cross die pad shown in FIG. 4; FIG. 7 and FIG. 8 are partially enlarged plan views each showing a structure obtained when a double-sided adhesive tape that is a modification of the double-sided adhesive tape shown in FIG. 6 is attached; FIG. 9 is a partial plan view showing the structure obtained after die bonding in the assembly of the QFP shown in FIG. 1; FIG. 10 is a partially enlarged cross-sectional view showing a sectional structure taken along line A—A shown in FIG. 9; FIG. 11 is a partially enlarged cross-sectional view showing the structure of a die bonding condition using a double-sided adhesive tape that is a modification, relative to the die bonding condition shown in FIG. 10; FIG. 12 is a partially enlarged cross sectional view showing the structure of a die bonding condition using molding resin paste and a single-sided adhesive tape modified, relative to the die bonding condition shown in FIG. 10; FIG. 13 is a partial plan view showing the structure obtained after wire bonding in the assembly of the QFP shown in FIG. 1; FIG. 14 is a partial plan view showing the structure obtained after wire bonding in the assembly using a small size semiconductor chip relative to the lead frame shown in FIG. 13; FIG. 15 is a partial cross-sectional view showing one example of the structure obtained by resin molding in the assembly of the QFP shown in FIG. 1; FIG. 16 is a partial plan view showing one example of the structure obtained after resin molding in the assembly of the QFP shown in FIG. 1; FIG. 17 is a side view showing one example of the structure after cutting and formation in the assembly of the QFP shown in FIG. 1; FIG. 18 is a partially enlarged cross-sectional view showing one example of the structure obtained at the time when exterior plating of an outer lead of the QFP is carried out after resin molding; FIG. 19 is a relational view showing relations between each semiconductor device and molding resin thickness in the embodiment of the present invention; FIG. 20 is a comparative view showing a technical concept of the semiconductor device according to the embodiment of the present invention; FIG. 21 is a diagram showing the results of wire crack inspection relative to the size and thickness of a molding resin portion in the semiconductor device according to the embodiment of the present invention; FIG. 22 is a partial plan view showing one example of the structure of a multiple lead frame used in the assembly of the QFP shown in FIG. 1; FIG. 23 is a partial cross-sectional view showing one example of the structure obtained by die bonding in the assembly of the QFP shown in FIG. 1; FIG. 24 is a partial cross sectional view showing one example of the structure obtained by wire bonding in the assembly of the QFP shown in FIG. 1; and FIG. 25 is a partial cross-sectional view showing one example of the structure obtained by cutting and formation in the assembly of the QFP shown in FIG. 1.

A semiconductor device that is an embodiment of the present invention is a molding resin sealed type device formed by molding and is also a surface packaging type device. The size (flat surface size and thickness) of molding resin 3 falls within a predetermined range. As one example of such a semiconductor device, a QFP (Quad Flat Package) 6 shown in FIG. 1 will be taken up and explained hereinafter.

In reference to FIG. 1 to FIG. 5, a structure of the QFP 6 will be explained hereinafter. The QFP comprises: a cross die pad 1g which supports a semiconductor chip 2 and which is smaller in outer size than a rear surface 2b opposite to a semiconductor die surface 2c of the semiconductor chip 2; wires 4 connected to pads 2a that are surface electrodes of the semiconductor chip 2; a plurality of inner leads 1b which extend around the semiconductor chip 2 and in which silver plating layers 1a are formed at wire bonding areas 1j to which the wires 4 are joined; molding resin 3 that is a resin sealing portion formed by resin molding the semiconductor chip 2 and the wires 4; and a plurality of outer leads 1c which are connected to the inner leads 1b and which protrude from the molding resin 3 in four directions and on which a lead-free metallic layer 1m is formed, as exterior plating, at least on a contact surface 1 connected to a packaging board such as a printed wiring board. Also, the QFP 6 can be LQFP (Low profile Quad Flat package) or a TQFP (Thin Quad Flat Package) in which the flat surface size (P×Q shown in FIG. 1) of the molding resin 3 is formed to be equal to or less than 28 mm×28 mm, or is one in which the flat surface size of the molding resin 3 is formed to be equal to or less than 28 mm×28 mm and in which the thickness (T shown in FIG. 2) thereof is formed to be 1.4 mm or less.

Further, the QFP 6 may be formed such that the flat surface size of the molding resin 3 is equal to or less than 20 mm×20 mm and the thickness thereof is formed to be 3 mm or less, or may be such an LQFP or a TQFP that the flat surface size of the molding resin 3 is formed to be equal to or less than 20 mm×20 mm.

Figure 32A:
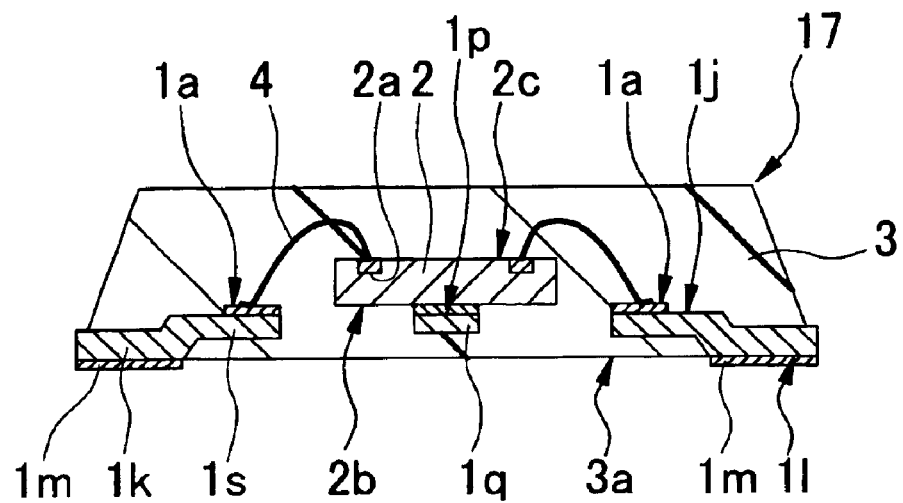
FIG. 32A is a view showing the structure of a QFN serving as a semiconductor device that is another embodiment of the present invention, and is a cross-sectional view.
Figure 32B:
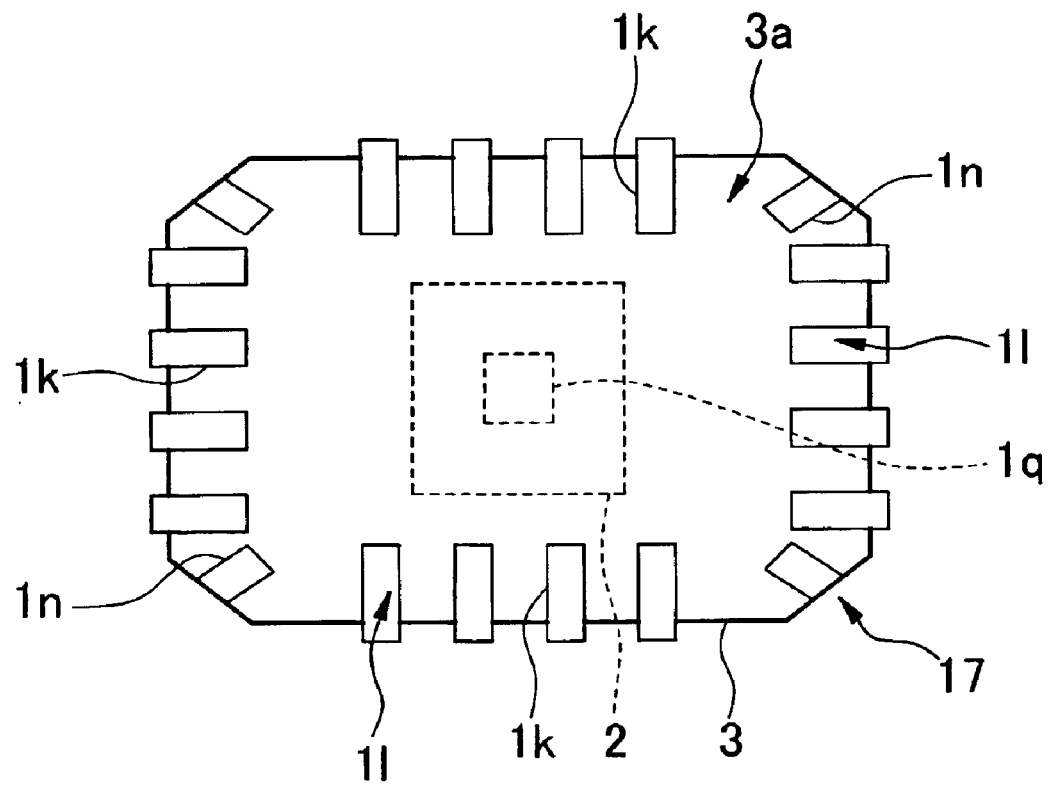
FIG. 32B is a view showing the structure of a QFN serving as a semiconductor device that is another embodiment of the present invention, and is a bottom surface view.

It should be noted that the structures of the LQFP and the TQFP are the same as that of the QFP 6 shown in FIG. 1 and FIG. 2, and, as shown in FIG. 19, by EIAJ Standards (Standards of Electronic Industries Association of Japan), the molding resin thickness (thickness of the molding resin 3) of each semiconductor device is defined and thereby the QFP 6, LQFP, TQFP, and a QFN (Quad Flat Non-leaded Package) 17 shown in FIG. 32 are classified.

In the present embodiment, attention is paid to the size (molding resin amount depending on the flat surface size and thickness) of each molding resin 3 of semiconductor devices having the QFP structure and the QFN structure, and, as shown in FIG. 19, by EIAJ Standards, especially by the molding resin thickness, the QFP 6 (molding resin thickness of 2.0 mm or more), the LQFP (molding resin thickness of 1.4 mm), the TQFP (molding resin thickness of 1.0 mm) and the QFN 17 (molding resin thickness of 0.45 to 2.50 mm) are classified, respectively.

Herein, an allowable range of the size of the molding resin 3 of the QFP 6 according to the present embodiment will be explained.

First, the QFP 6 according to the present embodiment is for realizing the use of lead-free solder when packaged. Note that the reflow temperature becomes high in a lead-free state, and, as a result, the molding resin amount during resin sealing increases in the semiconductor device whose the molding resin 3 is large, and accordingly molding resin stress also increases and the margin of each wire to wire cracks (including also wire disconnection) decreases.

Accordingly, in order to stabilize each wire relative to the wire cracks, palladium (Pd) plating is carried out on each wire bonding area 1j of the inner leads 1b and thereby the joint strength between each wire 4 and each inner lead 1b is enhanced and occurrence of the wire cracks can be prevented.

However, since palladium (Pd) plating is expensive, in the QFP 6 of the present embodiment a lower cost silver (Ag) plating layer 1a is formed on each wire bonding area 1j of the inner leads 1b, as shown in FIG. 2.

Therefore, the size of the molding resin 3 is limited and the molding resin amount is set to be small, and thereby the molding resin stress is reduced during high temperature reflow and the wire cracks and wire disconnection are prevented.

It should be noted that in order to realize the use of lead-free solder for the device being packaged, the lead-free metallic layer 1m which is an exterior plating is formed on a surface including at least the contact surface 1 of each outer lead 1c protruding from the molding resin 3.

Also, when lead-free solder is used, there is a tendency for molding resin cracks to occur as the reflow temperature becomes high. However, in the present invention, by employing the small cross die pad 1g whose a mounting portion (semiconductor chip mounting portion) has a smaller area than the rear surface 2b of the semiconductor chip 2 and by making part of the rear surface 2b of the semiconductor chip 2 be close to the molding resin of the molding resin 3, the close characteristic between the semiconductor chip 2 to be mounted and the molding resin 3 is increased, and the reflow characteristic is enhanced to permit the successful use of lead-free solder.

Accordingly, in the comparative view of the technical concepts shown in FIG. 20, use of the technical range corresponding to the lower left area surrounded by a dashed line among the illustrated four squares permits the use of lead-free solder.

Note that the cross die pad 1g is a semiconductor chip mounting portion provided at a crossing position of two suspension leads in.

In the QFP 6, FIG. 20 shows the results obtained by evaluating wire cracks (including also wire disconnection) and cost using, as parameters, a large or small size (that is, much or little molding resin amount) of the molding resin 3 and the plating kind (e.g., Ag plating or Pb plating) of each wire bonding area 1j of the inner leads 1b.

Like the lower left squares shown in FIG. 20, only in the case where the molding resin amount is made small (the size of the molding resin 3 is made large) and the silver plating layer 1a is formed on each wire bonding area 1j of the inner leads 1b both items of wire cracking and cost each have a circle symbol, and this condition has been taken into the technical concept of the present embodiment.

Further, with regard to a semiconductor device having the conventional QFP structure in which the silver plating layer 1a is formed on each wire bonding area 1j of the inner leads 1b and each wire 4 is joined to each silver plating layer 1a, FIG. 21 shows the results obtained by inspecting wire cracks (including also wire disconnection) with using, as parameters, the length of a side of each silver plating layer 1a and the molding resin thickness, on the predetermined condition that the semiconductor device is left in an atmosphere having a temperature of 85° C. and a humidity of 85% for 48 hours and thereafter infrared ray reflow for 10 seconds at 260° C. is carried out three times.

According to this, all devices for which the results when inspected are good are indicated with a circle. In other words, in devices indicated with a circle, the length of one side of the molding resin 3 (the length P or Q shown in FIG. 1) is 28 mm or less and the molding resin thickness is 1.4 mm or less.

Further, all test pieces were evaluated as preferable (o) if the length of one side of the molding resin 3 was set 20 mm or less, and the molding resin thickness was set 3.0 mm or less.

As a consequence, it is preferable that the allowable range of the size of the molding resin 3 in the QFP structure of this embodiment may fall within the case where the length of one side of the molding resin 3 is 28 mm or less and the molding resin thickness is 1.4 mm or less, or the case where the length of one side of the molding resin 3 is 20 mm or less and the molding resin thickness is 3.0 mm or less.

Incidentally, it is noted that a raw material for a lead frame used in the inspection shown in FIG. 21 can be a well known material such as an iron-nickel alloy or a copper alloy or the like.

Further, the wires 4 employed in the inspection are gold wires, each having a wire diameter of 30 μm.

Thereby, in the QFP 6 (including an LQFP and a TQFP) of the present embodiment, it is preferable to use a lead frame formed by a raw material such as an iron-nickel alloy, a copper alloy, or the like as the lead frame 1 shown in FIG. 3 and FIG. 22.

Further, it is preferable to use gold wires as the wires 4.

Also, the molding resin 10 which is shown in FIG. 15 and which is a seal molding resin for forming the molding resin 3 is, for instance, thermosetting epoxy resin.

It should be noted that the outer leads 1c are formed in a gull wing shape, and, as shown in FIG. 18, a lead-free metallic layer 1m as exterior plating of lead-free solder is formed on each surface thereof. Each of these lead free metallic layers 1m is a solder plating layer whose a fusion point is higher than that of tin-lead eutectic solder, and is, for example, an alloy obtained by adding either copper (Cu) or bismuth (Si), or copper and bismuth to an Sn—Ag based metal.

However, each lead-free metallic layer is not limited to the above-mentioned alloy, and an alloy of Zn, In, or Sb or the like, and Sn or an Sn based alloy may be employed as well.

Also, a die bonding material used for fixing the semiconductor chip 2 onto the cross die pad 1g is, for example, molding resin paste such as silver paste 8 or the like shown in FIG. 2 and FIG. 10. However, in the case of the cross die pad 1g since a joint area of the semiconductor chip 2 is small, a double-sided adhesive tape 5 as an adhesive tape shown in FIGS. 6 to 8 and FIG. 11 may be employed singly in order to reinforce the joint strength of the semiconductor chip 2.

The double-sided adhesive tape 5 may be such a cross shape as to match the shape of the cross die pad 1g, as shown in FIG. 6, or may be a thin rectangle as shown in FIG. 7. Alternatively, as shown in FIG. 8, the double-sided adhesive tape 5 may be employed by attaching a plurality of small double-sided adhesive tapes 5 onto one cross die pad 1g and the shape thereof, and the number of tape pieces to be attached, are not limited specifically.

Note that, as shown in FIG. 11, the double-sided adhesive tape 5 comprises a base film 5a such as polyamide tape or the like and adhesive layers 5b arranged on both of front and rear sides thereof. However, in the place of this double-sided adhesive tape 5, as shown in FIG. 12, a single-sided adhesive tape 7 comprising a tape base 5a and an adhesive layer 5b may be employed to laminate and combine this single-sided adhesive tape 7 and molding resin paste such as silver paste 8 or the like.

As mentioned above, by using an adhesive tape such as a double-sided adhesive tape 5, a single-sided adhesive tape 7 or the like as a die bonding material, it is possible to enhance the adhesion between the semiconductor chip mounting portion, such as the cross die pad 1g or the like, and the semiconductor chip 2, and thereby to suppress occurrence of molding resin cracks even in the case of a semiconductor device having a small semiconductor chip mounting portion, such as the cross die pad 1g and so on.

It is noted that, in the semiconductor chip 2, a desired semiconductor integrated circuit is formed on the semiconductor die surface 2c thereof, and bonding pads 2a formed on this semiconductor die surface 2c and the inner leads 1b corresponding thereto are connected through the wires 4, and further the outer leads 1c linked to the inner leads 1b are output to the outside of the molding resin 3 as external terminals of the QFP 6. Therefore, the transmission of signals between the semiconductor chip 2 and the outer leads 1c is made via the wires 4 and the inner leads 1b.

According to the QFP 6 (including an LQFP and a TQFP) of this embodiment, the size of the molding resin 3 is set such that the length of one side of the molding resin 3 is 28 mm or less and the molding resin thickness is 1.4 mm or less, or that the length of one side of the molding resin 3 is 20 mm or less and the molding resin thickness is 3.0 mm or less, and further the cross die pad 1g smaller in area than the rear surface 2b of the semiconductor chip 2 is packaged on the semiconductor chip 2 and the lead-free metallic layer 1m as exterior plating is formed on the outer leads 1c. Therefore, it is possible to improve a reflow characteristic (namely, it is possible to increase the margin of a reflow characteristic). As a result, it is possible to use high fusion point solder and to successfully realize the use of lead-free solder.

Moreover, the silver plating layer 1a is formed on each wire bonding area 1j of the inner leads 1b without using palladium (Pb) plating, and therefore the cost can be suppressed together with the realization of a lead-free structure.

Therefore, according to the QFP 6 (including an LQFP and a TQFP) of the present embodiment, it is possible to realize a lead-free structure without the occurrence of molding resin cracks and wire cracks (including wire disconnection and wire peeling-off).

Further, since the occurrence of molding resin cracks and wire cracks is suppressed, it is possible to enhance the reliability of the semiconductor device (the QFP 6).

Furthermore, by adopting the cross die pad 1g smaller in area than the rear surface 2b of the semiconductor chip 2, semiconductor chips 2 having a plurality of sizes can be packaged relative to one kind of lead frame 1, and consequently it is possible to reduce the number of kinds of lead frame 1 required. As a result, it is possible to achieve the standardization of the lead frame 1.

Next, a method of manufacturing the QFP 6 according to the present embodiment will be explained.

Note that the case will be explained where manufacture is carried out by employing, as the lead frame 1 to be used in the manufacturing method of the QFP 6, a lead frame 1 shown in FIG. 22 in which a plurality of units using, as a unit, a package body 1h shown in FIG. 3 are arranged in a row.

However, as an alternative, the lead frame 1 may use a matrix frame in which one package body 1h is arranged in matrix arrangement of plural lines× plural rows.

First, the lead frame 1 is prepared which has the cross die pad 1g that is shown in FIG. 4, which is a cross die pad smaller in outer size than the rear surface 2b of the semiconductor chip 2. The lead frame also includes a plurality of inner leads 1b, in which the silver plating layer 1a is formed at each wire bonding area 1j located near tips thereof and a plurality of outer leads 1c that is connected to the inner leads 1b and in which a lead-free metallic layer 1m are formed at least on the contact surfaces 1

Note that, herein, explanation will be made of the case wherein, for each package body 1h of the lead frame 1, as shown in FIG. 5, the silver plating layer 1a (hatched portions in FIG. 5) is formed in advance on each wire bonding area 1j of the inner leads 1b. and the lead-free metallic layer 1m (hatched portion in FIG. 5) is formed on a surface including the contact surface 1 in the area corresponding to each outer lead 1c. However, the lead-free metallic layer 1m may not be formed prior to assembly. In this case, the following assembly is executed in this order: after molding, the lead-free metallic layer 1m is formed on each outer lead 1c protruding from the molding resin 3; and, thereafter, cutting and formation is carried out.

Also, each package body 1h includes a suspension lead in for supporting the cross die pad 1g; a plurality of inner leads 1b extending in four directions around the cross die pad 1g; and the outer leads 1c serving as external terminals and formed integrally with each inner lead; and dam bars 1i for preventing molding resin (molding resin 10 shown in FIG. 15) from flowing out during the molding operation. Each outer lead 1c is supported by frame portions if sectioning each package body 1h.

Further, on each of these frame portions if, a locating hole 1d and a pilot hole 1e for transferring the lead frame 1 during die bonding and wire bonding are formed.

It is to be noted that, in FIG. 3, the portion corresponding to a lower left suspension lead in among the four illustrated suspension leads 1n becomes a molding gate 1t during molding.

Subsequently, when molding resin paste such as silver paste 8 or the like is used as a die bonding material, an appropriate amount of silver paste 8 is applied onto a die pad 1p of each cross die pad 1g by potting or the like.

However, when an adhesive tape such as the double-sided adhesive tape 5 shown in FIGS. 6 to 8 or FIG. 11, the single-sided adhesive tape 7 shown in FIG. 12, or the like is used without using the molding resin paste as a die bonding material, the above-mentioned adhesive tape may be attached in advance onto the die pad 1p of the cross die pad 1g in each package body 1h of the lead frame 1 at the start of the assembly operation or the above-mentioned adhesive tape may be attached at the start of the die bonding process.

Thereafter, in each package body 1h, as shown in FIG. 23, die bonding (also referred to as pellet bonding or chip mounting) is carried out to mount the semiconductor chip 2 onto the cross die pad 1g via a die bonding material (silver paste 8) by use of a collet 12.

Namely, the rear surface 1b of the semiconductor chip 2 and the die pad 1p of the cross die pad 1g are joint via the die bonding material consisting of molding resin paste or an adhesive tape or both.

At this time, as shown in FIG. 23, in order to move the semiconductor chip 2, first the cross die pad 1g of the lead frame 1 is arranged onto a stage 11 of a die bonder, and then the semiconductor chip 2 is sucked and held by the collet 12.

Then, the semiconductor chip 2 is lowered by the collet 12 and the semiconductor chip 2 is arranged onto the cross die pad 1g. By adding a slight load from the collet 12 onto the semiconductor chip 2 and heating to the semiconductor chip 2 from the stage 11 via the cross die pad 1g. the semiconductor chip 2 is fixed via the die bonding material such as silver paste 8 or the like, as shown in FIG. 9 and FIG. 10.

Thereafter, as shown in FIG. 2, the bonding pads 2a of the semiconductor chip 2 and the inner leads 1b corresponding thereto are connected by wire bonding.

Namely, wire bonding is carried out by use of the bonding wires 4 such as gold wires or the like, and thereby the bonding pads 2a of the semiconductor chip 2 and the wire bonding areas 1j of the inner leads 1b corresponding thereto are connected with the wires 4.

At this time, as shown in FIG. 24, the semiconductor chip 2 is placed on the stage 13 of the wire bonder, and, first, connection to each wire 4 on a side of the semiconductor chip 2 is carried out by a capillary 14 as a first bonding operation, and, thereafter, connection between each wire 4 and each wire bonding area 1j of the inner leads 1b is carried out as a second bonding operation.

This operation, as shown in FIG. 13, is carried out in sequence with regard to each of the bonding pads 2a shown in FIG. 24 which are located on the semiconductor die surface 2c of the semiconductor chip 2.

It is noted that, since the silver plating layer 1a, as shown in FIG. 2 and FIG. 5, is formed on each wire bonding area 1j of each inner lead 1b the wires 4 of gold wires and the silver plating layer 1a are connected, and, thereby, the connection strength between the wires 4 and the inner leads 1b can be enhanced.

Also, as shown in FIG. 14, even in the case of using a small semiconductor chip 2 which has been shrunk and thereby becomes a small size, the wire length increases but the wire bonding can still be carried out.

After completion of wire bonding, the semiconductor chip 2 and the cross die pad 1g and the wires 4 and respective inner leads 1b are resin sealed by a molding method, and thereby the molding resin 3 is formed, as shown in FIG. 16.

It is noted that molding resin (molding resin 10 shown in FIG. 15) to be used in the above-mentioned molding is, for example, epoxy based thermosetting resin or the like.

At this time, as shown in FIG. 2, the semiconductor chip 2 of the lead frame 1 and the wires 4 are arranged onto a cavity 18a of a molding die 18 shown in FIG. 15 such that a plurality of outer leads 1c, in which a lead-free metallic layer 1m is formed on the contact surface 1, protrude from the molding resin 3. Thereafter, closing is carried out, and molding resin 10 is injected into the cavity 18a and resin molded.

It is noted that, in this embodiment, an LQFP or a TQFP is assembled in which the flat surface size of the molding resin 3 is formed to be equal to or less than 28 mm×28 mm, or the QFP 6 is assembled in which the flat surface size of the molding resin 3 is formed to be equal to or less than 28 mm×28 mm and the thickness thereof is formed to be 1.4 mm or less.

This is determined according to the size (size in flat surface direction and depth) of the cavity 18a of the molding die 18 for forming the molding resin 3, and, accordingly, the shape and depth of the cavity 18a are set such that the molding resin 3 is formed according to the size thereof.

Further, the QFP 6 may be formed such that the flat surface size of the molding resin 3 is formed to be equal to or less than 20 mm×20 mm and the thickness thereof is formed to be 3 mm or less, or an LQFP or a TQFP may be formed such that the flat surface size of the molding resin 3 is formed to be equal to or less than 20 mm×20 mm. Accordingly, molding is variously carried out by use of the molding die 18 having the cavity 18a corresponding to the size of this molding resin 3.

It is noted that, in each package body 1h of the lead frame 1 shown in FIG. 3, the molding resin 3 is formed in the inside area of each dam bar 1i, as shown in FIG. 16.

After completion of resin sealing, a plurality of outer leads 1c protruding from the molding resin 3 are cut and removed from the respective frame portions 1f of the lead frame 1 by use of a die or the like for cutting and formation.

At that time, as shown in FIG. 25, by use of the above-mentioned die 16 for cutting and formation and a stamping die 15, the outer leads 1c are bent and cut (separated from the frame portions 1f), and then the outer leads 1c are bent and formed in a gull wing shape.

Thereby, it is possible to manufacture the QFP 6 (semiconductor device) shown in FIG. 17, and the lead-free metallic layer 1m is formed at least on the contact surface 1 (in this case the whole surface) of each outer lead 1c in this QFP 6.

It is noted that, in the case of an assembly made by use of the lead frame 1 in which the lead-free metallic layer 1m is not formed on a surface including the contact surface 1i of an area corresponding to each outer lead 1c at the start of assembly, molding is performed, and, thereafter, the lead-free metallic layer 1m is formed on each of the outer leads 1c protruding from the molding resin 3, and then cutting and formation are carried out to provide the shape shown in FIG. 18.

The invention made by the present inventors has been explained in detail according to the embodiments of the invention. However, the present invention is not limited to the above-mentioned embodiments, and, needless to say, may be variously changed and modified without departing from the sprit thereof.

For example, in the above-mentioned embodiments, the case has been described where the semiconductor chip mounting portion supported by the suspension leads 1n is a cross die pad 1g smaller in outer size than the rear surface 2b of the semiconductor chip 2. However, it is preferable that the above-mentioned semiconductor chip mounting portion may be smaller in outer size than the rear surface 2b of the semiconductor chips 2, and some modifications of such a semiconductor chip mounting portion are shown in FIG. 26 to FIG. 29, and these modifications are referred to as small die pads 1q.

Figure 26:
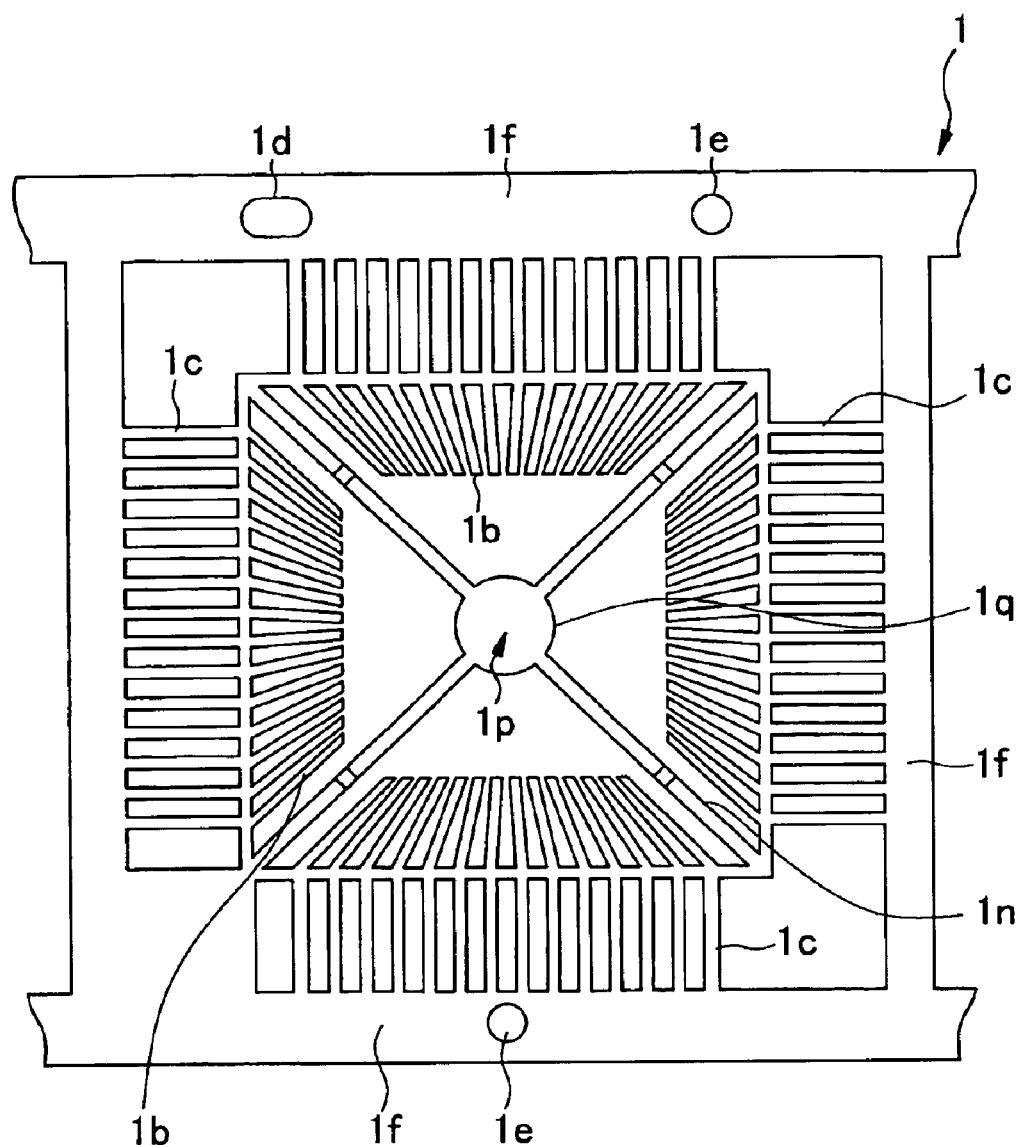
FIG. 26 is a partial plan view showing the structure of a die pad of a lead frame that is a modification, relative to the lead frame shown in FIG. 3.

First, the small die pad 1q shown in FIG. 26 is formed in a small circular shape.

Namely, the die pad 1p thereof is formed in a small circular shape.

Figure 27:
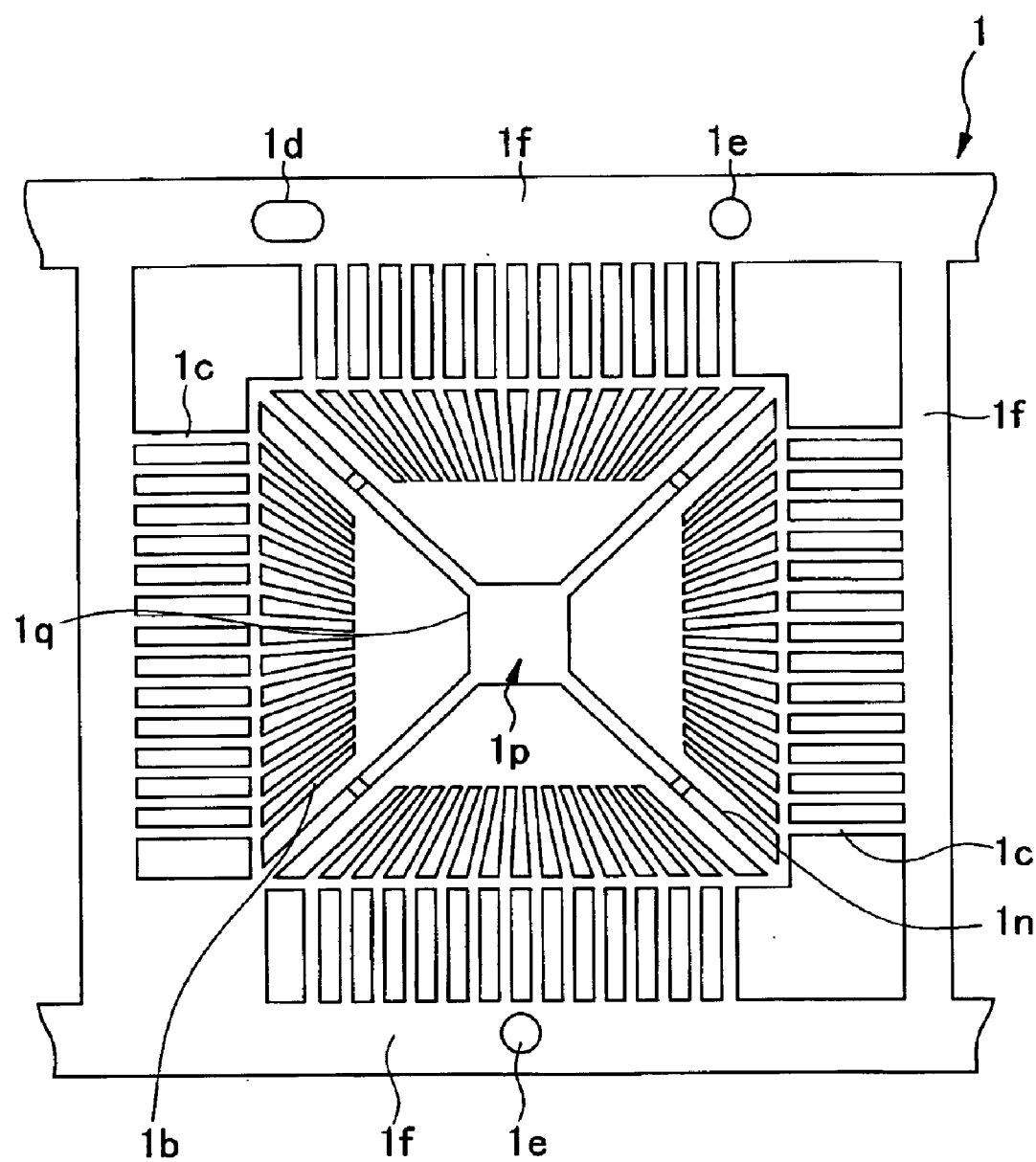
FIG. 27 is a partial plan view showing the structure of a die pad of a lead frame that is a modification, relative to the lead frame shown in FIG. 3.

Further, the small die pad 1q shown in FIG. 27 is formed in a small square shape.

Figure 28:
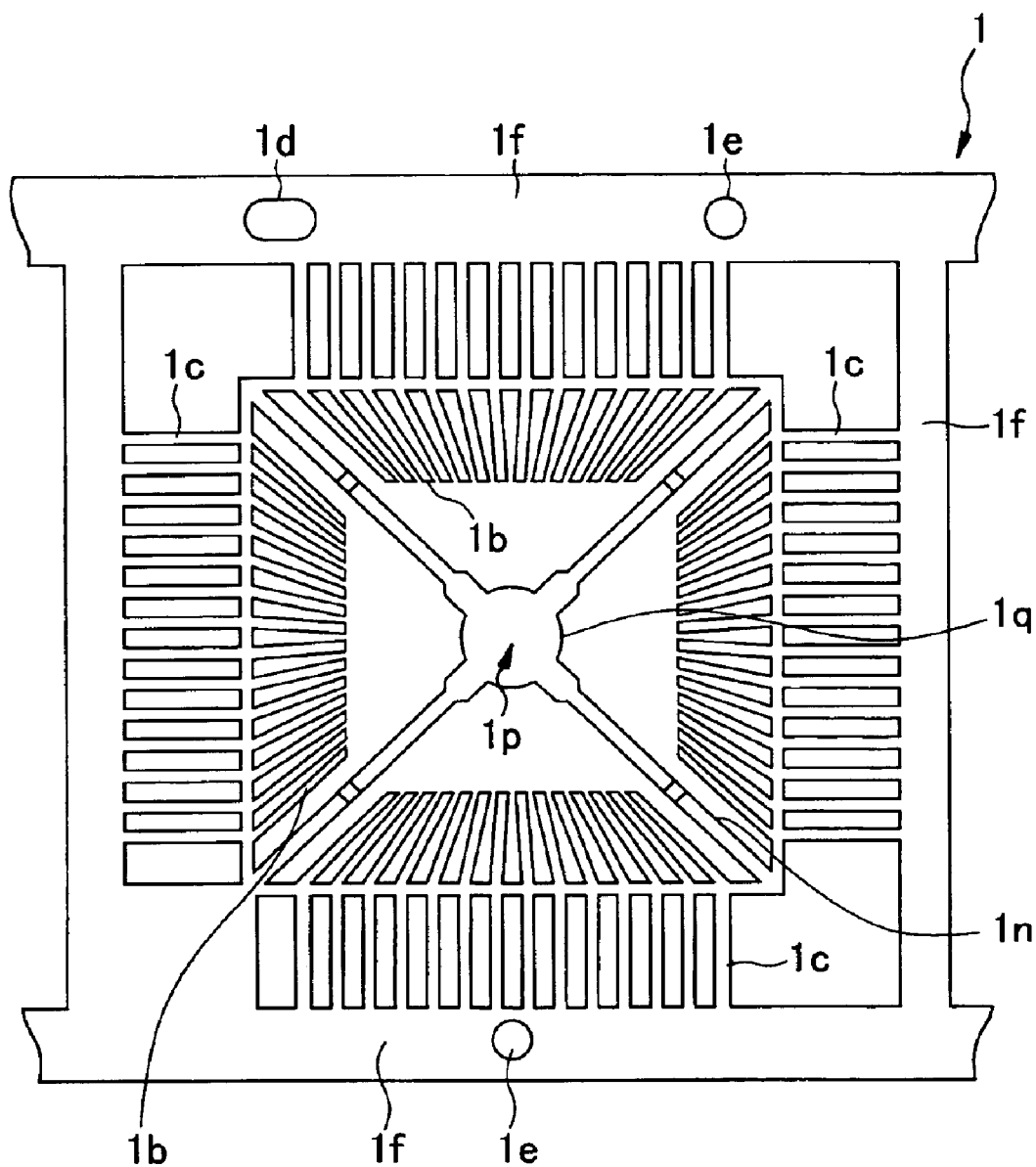
FIG. 28 is a partial plan view showing the structure of a die pad of a lead frame that is a modification, relative to the lead frame shown in FIG. 3.

The small circular die pad 1q shown in FIG. 28 is formed in such a shape as to combine the small die pad 1q having a small circle shape as shown in FIG. 26 and the cross die pad 1g shown in FIG. 3.

Figure 29:
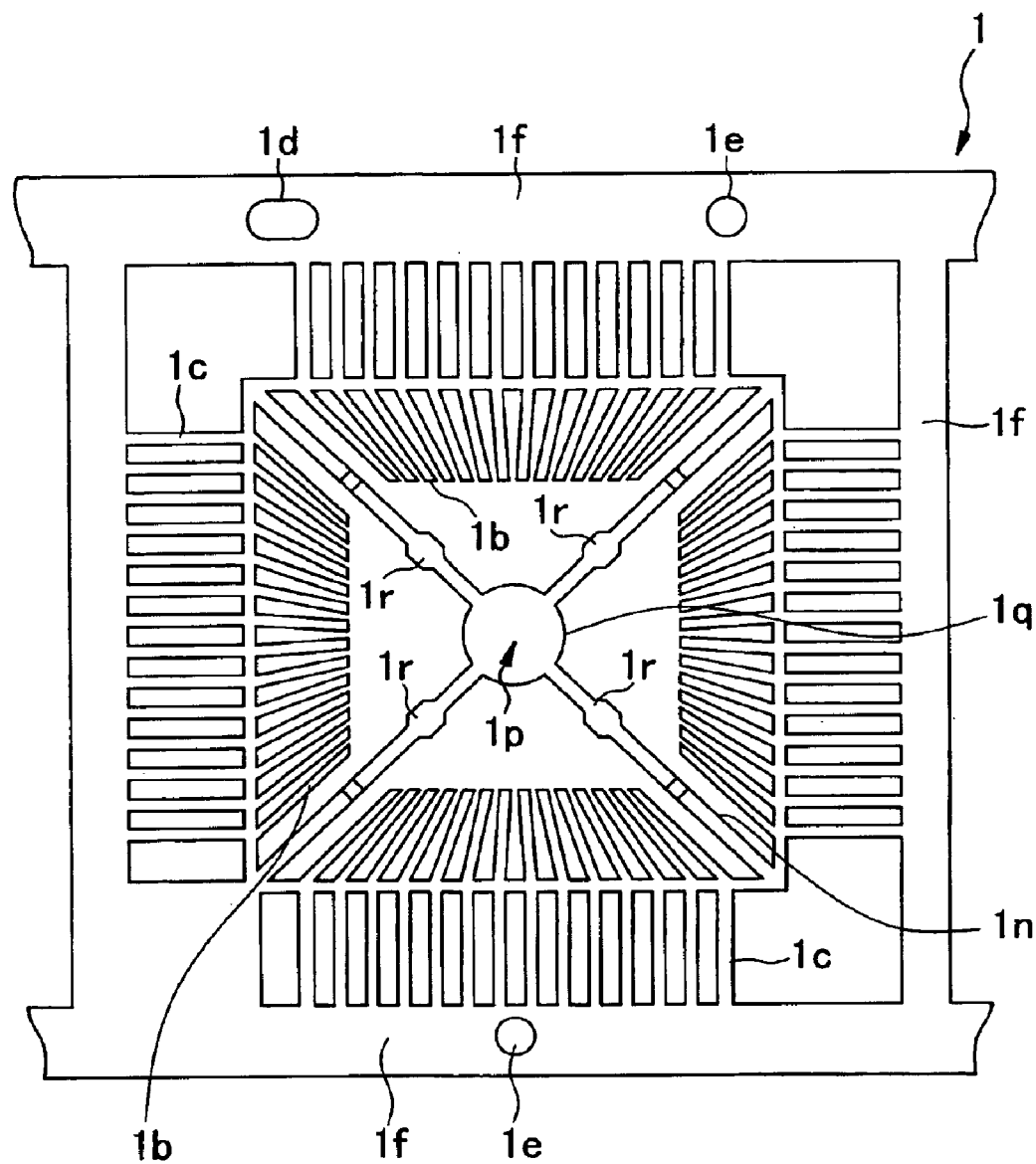
FIG. 29 is a partial plan view showing the structure of a die pad of a lead frame that is a modification, relative to the lead frame shown in FIG. 3.

Further, the small die pad 1q shown in FIG. 29 is formed in such a shape as to provide islands 1r outside the circular small die pad 1q of each suspension lead in, and thereby it is possible to stably mount various sizes of the semiconductor chip 2.

Figure 30:
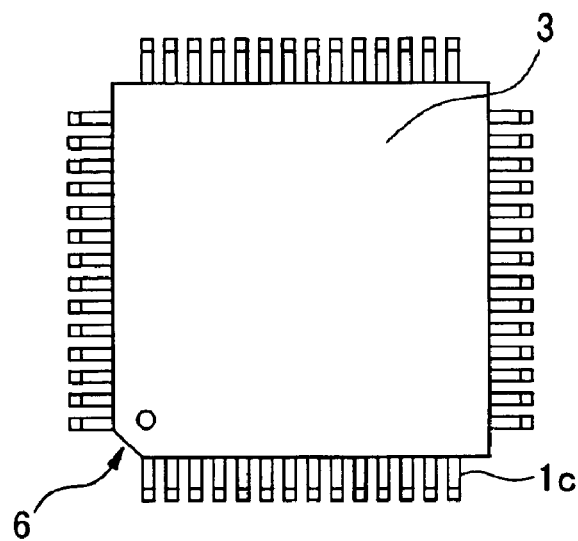
FIG. 30 is a plan view showing the structure of a QFP to be assembled by use of the lead frame that is a modification of the invention and is shown in FIG. 26.
Figure 31:
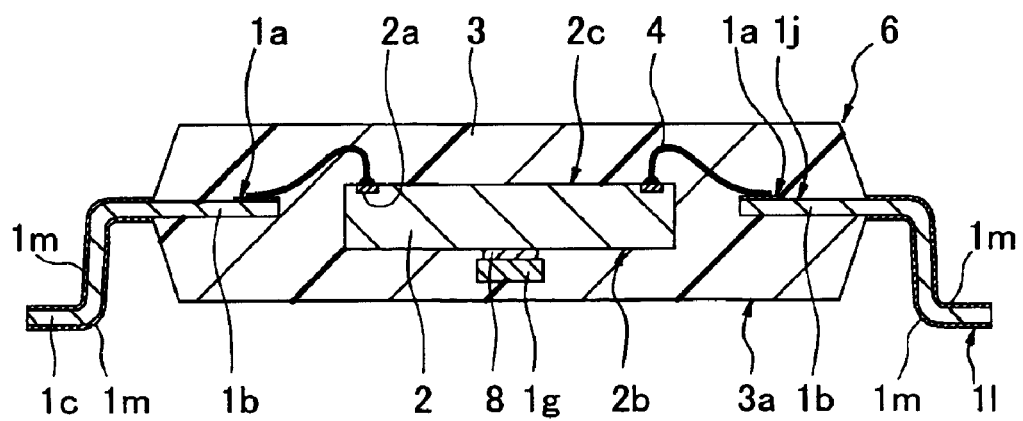
FIG. 31 is a cross-sectional view showing the structure of the QFP in FIG. 30.

Note that one example of the QFP 6 assembled by use of the lead frame 1 having modifications of the small die pad 1q shown in FIG. 26 to FIG. 29 is illustrated in FIG. 30 and FIG. 31.

Even the QFP 6 shown in FIG. 30 and FIG. 31 and incorporating the small die pad 1q therein can obtain the same effects as the QFP 6 having the small die pad 1g according to the above-mentioned embodiment.

Further, the small die pad 1q, similarly to the case of the cross die pad 1g may be applied even to an LQFP and a TQFP.

Also, in the above-mentioned embodiments, the case has been described where the semiconductor device is either a QFP 6, an LQFP or a TQFP. However, the semiconductor device may also be a QFN 17 as shown in other embodiments of FIGS. 32A and 32B.

Namely, the QFN 17 includes a small die pad 1q (or a cross die pad 1g) smaller in outer size than the semiconductor chip 2; a plurality of inner lead portions 1s in which the silver plating layer 1a is formed on each wire bonding area 1j; and a plurality of outer lead portions 1k arranged so as to be exposed to the circumferential portion of the rear surface (surface of a packaging side) 3a of the molding resin 3, and forming the lead-free metallic layer 1m on the contact surface 11.

Even the case of the QFN 17 mentioned above can obtain the same effects as the QFP 6 taken out of the above-mentioned embodiment.

The effects obtained by the representative ones among the inventions disclosed in this application will be briefly explained below.

(1) The size of the molding resin is set such that the length of one side of the molding resin is 28 mm or less and the molding resin thickness is 1.4 mm or less, or the length of one side of the molding resin is 20 mm or less and the molding resin thickness is 3.0 mm or less. Further, the semiconductor chip is mounted on the cross die pad or the small die pad and the lead-free metallic layer is formed on each of the outer leads. Thereby, it is possible to improve a reflow characteristic and realize the successful use of lead-free solder.

(2) The silver plating layer in the place of palladium plating is formed on the wire bonding area of the inner leads, and thereby it is possible to suppress the cost and realize the successful use of lead-free solder.

What is claimed is:

1. A semiconductor device comprising:
    a cross-shaped die pad supporting a semiconductor chip and being smaller in outer size than a rear surface of said semiconductor chip which is connected to said die pad with a plurality of small double-sided adhesive tapes;
    a wire connected to a surface electrode of said semiconductor chip;
    a plurality of inner leads located around said semiconductor chip, in which a silver plating layer is formed at a wire bonding area of at least one of the inner leads to which said wire is bonded,
    a molding resin for resin sealing said semiconductor chip; and
    a plurality of outer leads respectively connected to the inner leads and protruding from the molding resin, in which a lead-free metallic layer is formed on a contact surface,
    wherein the flat surface size of said molding resin is formed to be equal to or less than 28 mm×28 mm and the thickness thereof is formed to be 1.4 mm or less; and
    wherein said lead-free metallic layer formed on said outer leads is a metallic layer formed after bonding said wire to said wire bonding area of said at least one inner lead.

2. The semiconductor device according to claim 1, wherein said lead-free metallic layer is a solder plating layer having a fusion point higher than tin-lead eutectic solder.

3. The semiconductor device according to claim 1, wherein said lead-free metallic layer is a metallic layer formed after forming said molding resin.

* * * * *